United States Patent
Krishnamurthi

(10) Patent No.: US 10,581,381 B2
(45) Date of Patent: Mar. 3, 2020

(54) RECONFIGURABLE POWER EFFICIENT MIXERS

(71) Applicant: BAE SYSTEMS INFORMATION AND ELECTRONIC SYSTEMS INTEGRATION INC., Nashua, NH (US)

(72) Inventor: Kathiravan Krishnamurthi, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/174,418

(22) Filed: Oct. 30, 2018

(65) Prior Publication Data

US 2019/0267945 A1    Aug. 29, 2019

Related U.S. Application Data

(63) Continuation-in-part of application No. PCT/US2018/020143, filed on Feb. 28, 2018.

(51) Int. Cl.
*H03D 7/14* (2006.01)
*H04B 1/16* (2006.01)

(52) U.S. Cl.
CPC ......... *H03D 7/1425* (2013.01); *H03D 7/1433* (2013.01); *H03D 7/1458* (2013.01); *H04B 1/16* (2013.01); *H03D 2200/0023* (2013.01); *H03D 2200/0025* (2013.01); *H03D 2200/0084* (2013.01)

(58) Field of Classification Search
CPC ......... H03D 7/1425; H03D 2200/0025; H03D 2200/0084; H04B 1/16
USPC ......................................................... 327/357
See application file for complete search history.

(56) References Cited

U.S. PATENT DOCUMENTS

| | | | | |
|---|---|---|---|---|
| 6,026,286 A | * | 2/2000 | Long | H03D 7/1433 455/319 |
| 6,157,822 A | * | 12/2000 | Bastani | H03D 7/1433 455/292 |
| 6,230,001 B1 | * | 5/2001 | Wyse | H03D 7/1425 327/357 |

(Continued)

OTHER PUBLICATIONS

Gilbert, "A Precise Four-Quadrant Multiplier with Subnanosecond Response," IEEE Journal of Solid-State Circuits, Dec. 1968, pp. 365-373, vol. 3, No. 4.

(Continued)

*Primary Examiner* — Ryan Jager
(74) *Attorney, Agent, or Firm* — Sand, Sebolt & Wernow LPA; Scott J. Asmus

(57) ABSTRACT

Embodiments of power efficient radio frequency mixers are provided. A generalized impedance matched low-voltage active mixer circuit technique, which utilizes a plurality of commutator cells and transformers, is disclosed. The active mixer techniques are reconfigurable between various operation configurations based, at least in part, on selectively activating at least one of a plurality of commutator cells. The low voltage active mixer function is coupled to an impedance matched amplifier which can be bypassed allowing changes in the gain of the mixer circuit suites while preserving impedance matching.

20 Claims, 17 Drawing Sheets

(56) References Cited

U.S. PATENT DOCUMENTS

| | | | | |
|---|---|---|---|---|
| 6,847,808 | B2* | 1/2005 | Zhou | H03D 7/1441 327/206 |
| 6,856,199 | B2 | 2/2005 | Komijani et al. | |
| 7,599,675 | B2* | 10/2009 | Mu | H03D 7/1441 375/345 |
| 8,963,610 | B2* | 2/2015 | Mishra | G06G 7/12 327/355 |
| 9,735,734 | B2* | 8/2017 | Mu | H03D 7/1441 |
| 2003/0078026 | A1 | 4/2003 | Monge | |
| 2003/0199259 | A1 | 10/2003 | Macedo et al. | |
| 2005/0118979 | A1 | 6/2005 | Langenberg et al. | |
| 2005/0239430 | A1* | 10/2005 | Shah | H03D 7/14 455/326 |
| 2006/0205370 | A1* | 9/2006 | Hayashi | H03D 7/1441 455/209 |
| 2007/0087711 | A1* | 4/2007 | Pan | H03C 3/40 455/127.4 |
| 2008/0096516 | A1* | 4/2008 | Mun | H03F 1/26 455/341 |
| 2009/0239592 | A1* | 9/2009 | Deng | H04B 1/16 455/574 |
| 2010/0041359 | A1* | 2/2010 | Liu | H03F 1/32 455/311 |
| 2017/0288764 | A1* | 10/2017 | Croman | H04B 1/0064 |

OTHER PUBLICATIONS

Long, "A 1.9 GHz Low-Voltage Silicon Bipolar Receiver Front-End for Wireless Personal Communications Systems," IEEE Journal of Solid-State Circuits, Dec. 1995, pp. 1438-1448, vol. 30, No. 12.

Aoki, "Distributed Active Transformer—A New Power-Combining and Impedance-Transformation Technique," IEEE Transactions on Microwave Theory and Techniques, Jan. 2002, pp. 316-331, vol. 50, No. 1.

Reynolds, "A Silicon 60-GHz Receiver and Transmitter Chipset for Broadband Communications," IEEE Journal of Solid-State Circuits, Dec. 2006, pp. 2820-2831, vol. 41, No. 12.

Xiao, "A High Dynamic Range CMOS Variable Gain Amplifier for Mobile DTV Tuner," IEEE Journal of Solid-State Circuits, Feb. 2007, pp. 292-301, vol. 42, No. 2.

Pfeiffer, "A 23-dBm 60-GHz Distributed Active Transformer in a Silicon Process Technology," IEEE Transactions on Microwave Theory and Techniques, May 2007, pp. 857-865, vol. 55, No. 5.

Reynaert, "Power Combining Techniques for RF and mm-wave CMOS Power Amplifiers," ESSCIRC 2007—33rd European Solid-State Circuits Conference, Sep. 2007, pp. 272-275.

Xuan, "A 92 mW, 20 dB gain, broadband lumped SiGe amplifier with bandwidth exceeding 67 GHz," Bipolar/BiCMOS Circuits and Technology Meeting (BCTM), 2013 IEEE, Sep. 30, 2013, pp. 107-110.

Li, "Design of Very Compact Bandpass Filters Based on Differential Transformers," IEEE Microwave and Wireless Components Letters, Jul. 2015, pp. 439-441, vol. 25, No. 7.

Chen, "An Ultra-Wideband Variable Gain Low Noise Amplifier," 2016 IEEE International Conference on Ubiquitous Wireless Broadband (ICUWB), Dec. 19, 2016, 4 pages.

https://www.electronics-tutorials.ws/capacitor/capacitive-voltage-divider.html, Capacitive Voltage Divider, printed Jul. 30, 2018, 11 pages.

https://novatel.com/an-introduction-to-gnss/chapter-5-resolving-errors/multi-constell . . . , printed Jul. 30, 2018, 1 page.

* cited by examiner

RECONFIGURABLE POWER EFFICIENT MIXERS

CROSS REFERENCE TO RELATED APPLICATIONS

This application is a continuation-in-part application and claims the benefit of PCT Patent Application Serial Number PCT/US2018/020143, filed on Feb. 28, 2018; the disclosure of which is incorporated herein by reference.

BACKGROUND

Technical Field

The present disclosure relates to systems and methods for communication systems. More particularly, the present disclosure relates to radio frequency (RF) mixers. Specifically, the present disclosure relates to reconfigurable power efficient RF mixers with improved power gain and dynamic range.

Background Information

Generally, radio frequency (RF) is any frequency within the electromagnetic spectrum associated with radio wave propagation. Typically, applying an RF current to an antenna creates an electromagnetic field that is able to propagate through space. One exemplary wireless technology that utilizes RF field propagation includes RF mixers.

Generally, an RF mixer is an electronic device used in radio receivers and transmitters to convert the frequency of an input signal. Generally, there are active RF mixers and passive RF mixers.

One exemplary active RF mixer is a Gilbert cell mixer which typically utilizes bipolar transistors to operate as a precision multiplier and is typically used in modern communication systems as a mixer and frequency translator. However, for many RF applications, the Gilbert cell mixer typically suffers from higher noise and lower power gain compared to a passive RF mixer followed by an intermediate frequency (IF) amplifier. One exemplary shortcoming of the Gilbert cell mixer is the impedance mismatch of the transconductor to the quad core where the transconductor is loaded by low impedance of the quad core. Other exemplary shortcomings associated with the Gilbert cell mixer, include, inter alia, that the Gilbert cell mixer typically has noise figures of eight to ten decibels (dB) for high linearity applications, the image noise present at the transconductor output is typically present in the band of interest after mixing which increases the noise level of the Gilbert cell mixer.

SUMMARY

There remains a need in the art for an improved radio frequency (RF) mixer. The present disclosure addresses these and other issues.

In one aspect, the present disclosure may provide an RF mixer apparatus comprising a plurality of transformers. Each of the plurality of transformers includes a primary and a secondary and each primary is connected in series. The RF mixer apparatus further includes a radio frequency (RF) port and a plurality of commutator cells. Each of the plurality of commutator cells is coupled to a local oscillator (LO) port in parallel and an intermediate frequency (IF) port in parallel. Each secondary is connected across one commutator cell of the plurality of commutator cells.

In one example, the plurality of transformers are 1:1 transformers. The RF mixer apparatus may further include a plurality of current sources providing a total commutator cell current to the plurality of commutator cells. In one example, the total commutator cell current is split equally between the plurality of commutator cells.

The RF mixer apparatus may further include a total commutator cell impedance presented by the plurality of commutator cells and an RF source impedance presented to the RF port. In one example, the total commutator cell impedance is matched to the RF source impedance.

The RF mixer apparatus may further include an amplifier mechanism connected across the series connection of the primaries of the plurality of transformers. The RF mixer apparatus may further include an output impedance presented by the amplifier mechanism. In one example, the total commutator cell impedance matches the output impedance of the amplifier mechanism.

In one example, the RF mixer apparatus may further include a primary tap and a voltage supply connected to the primary tap to provide a voltage to the amplifier mechanism.

In one example, the RF mixer apparatus may further include a center-tapped secondary of each of the plurality of transformers and a primary tap. Each center-tapped secondary of the plurality of transformers is connected to the primary tap to supply a voltage to the amplifier mechanism. The amplifier mechanism reuses the total commutator cell current through the primary tap.

The RF mixer apparatus may further include a filter mechanism connected to the plurality of commutator cells and the amplifier mechanism. In one example, the amplifier mechanism is a series-shunt feedback amplifier configured to provide a variable gain.

In another aspect, the present disclosure may provide an RF mixer apparatus comprising a plurality of transformers. Each of the plurality of transformers includes a primary and a secondary and each primary is connected in series. The RF mixer apparatus may further include a plurality of commutator cells. Each of the plurality of commutator cells is respectively coupled to a local oscillator (LO) port. Each of the plurality of commutator cells is respectively coupled to an intermediate frequency (IF) port. Each secondary is connected across one commutator cell of the plurality of commutator cells. Each secondary is connected across one commutator cell of the plurality of commutator cells. The RF mixer apparatus may further include a plurality of IF filter mechanisms respectively connected between each of the plurality of commutator cells and each of the respective IF ports. The RF mixer apparatus may further include an amplifier mechanism connected across the series connection of the primaries of the plurality of transformers. In one example, the plurality of transformers are 1:1 transformers.

The RF mixer apparatus may further include a filter mechanism connected to the plurality of commutator cells and the amplifier mechanism. In one example, the amplifier mechanism is a series-shunt feedback amplifier configured to provide a variable gain.

The RF mixer apparatus may further include at least one current source providing a total commutator cell current to the plurality of commutator cells. In one example, the total commutator cell current is split equally between the plurality of commutator cells.

The RF mixer apparatus may further include a center-tapped secondary of each of the plurality of transformers and a primary tap. Each center-tapped secondary of the plurality of transformers is connected to the primary tap to supply a voltage to the amplifier mechanism. The amplifier mechanism reuses the total commutator cell current through the primary tap.

The RF mixer apparatus may further include a total commutator cell impedance presented by the plurality of commutator cells and an RF source impedance presented to the RF port. The total commutator cell impedance is matched to the RF source impedance.

The RF mixer apparatus may further include a total commutator cell impedance presented by the plurality of commutator cells and an output impedance presented by the amplifier mechanism. The total commutator cell impedance matches the output impedance.

In another aspect, the present disclosure may provide embodiments of power efficient radio mixers. A generalized impedance matched low-voltage active mixer circuit technique, which utilizes a plurality of commutator cells and transformers, is disclosed. The low voltage active mixer function is coupled to an impedance matched amplifier for insertion of image rejection filtering between the amplifier and the mixing function. The commutator cells can be driven in parallel by common local oscillator (LO) and intermediate frequency (IF) ports combined in parallel to yield highly linear mixers. A multi-channel receiver with a common impedance matched radio frequency (RF) amplifier driving a plurality of commutator cells with multiple LOs and IFs is also disclosed.

In one aspect, the present disclosure may provide an RF mixer apparatus comprising a plurality of transformers. Each of the plurality of transformers includes a primary and a secondary and each primary is connected in series. The RF mixer apparatus further includes a radio frequency (RF) port and a plurality of commutator cells. Each of the plurality of commutator cells is coupled to a local oscillator (LO) port in parallel and an intermediate frequency (IF) port in parallel. Each secondary is connected across one commutator cell of the plurality of commutator cells.

In one aspect, the present disclosure may provide a radio frequency (RF) mixer apparatus comprising a plurality of transformers; wherein each of the plurality of transformers includes a primary and a secondary; wherein each primary is connected in series, a plurality of selectively active commutator cells; wherein each of the plurality of commutator cells is coupled to a local oscillator (LO) port in parallel and an intermediate frequency (IF) port in parallel; and wherein each secondary is connected across one selectively active commutator cell of the plurality of commutator cells, a plurality of selectively active current sources selectively providing a total commutator cell current to the plurality of selectively active commutator cells. The operation of the RF mixer apparatus is reconfigurable based, at least in part, on the plurality of selectively active commutator cells.

The RF mixer apparatus may further include at least one switching device operatively coupled to at least one of the plurality of selectively active commutator cells. The at least one switching device is configured to selectively activate at least one of the plurality of selectively active current sources.

The RF mixer apparatus may further include a gain and an amplifier mechanism connected across the series connection of the primaries of the plurality of transformers. The amplifier mechanism is configured to change the gain of the RF mixer apparatus.

The RF mixer apparatus may further include a total commutator cell impedance presented by the plurality of selectively active commutator cells, an RF source impedance presented to an RF port, and an output impedance presented by the amplifier mechanism. The total commutator cell impedance is substantially matched to the RF source impedance; and wherein when the at least one switching device causes an RF signal to bypass the amplifier mechanism, the total commutator cell impedance is substantially matched to the RF source impedance.

The RF mixer apparatus may further include at least one switching device operatively coupled to the amplifier mechanism. The at least one switching device is configured to selectively bypass the amplifier mechanism. When the amplifier mechanism is bypassed the total commutator cell impedance is substantially matched to the RF source impedance.

In one aspect, the present disclosure may provide a method comprising selectively activating at least of one of a plurality of commutator cells in a radio frequency (RF) mixer apparatus, operating the RF mixer apparatus in a first operation configuration based, at least in part, on the selectively activated at least one commutator cell, and operating the RF mixer apparatus in a second operation configuration based, at least in part, on the selectively activated at least one commutator cell that is different than the selectively activated at least one commutator cell of the first operation configuration.

In one embodiment, the method may include actively powering one commutator cell in the first operation configuration and actively powering two commutator cells in the second operation configuration.

In one embodiment, the method may include actively powering one commutator cell in the first operation configuration and actively powering three commutator cells in the second operation configuration.

In one embodiment, the method may include operating the RF mixer apparatus in a third operation configuration based, at least in part, on the selectively activated at least one commutator cell that is different than the selectively activated at least one commutator cell of the first operation configuration and the selectively activated at least one commutator cell of the second operation configuration, actively powering one commutator cell in the first operation configuration, actively powering two commutator cells in the second operation configuration, and actively powering four commutator cells in the third operation configuration.

In one aspect, the present disclosure may provide power efficient radio mixers. A generalized impedance matched low-voltage active mixer circuit technique, which utilizes a plurality of commutator cells and transformers, is disclosed. The active mixer techniques are reconfigurable between various operation configurations based, at least in part, on selectively activating at least one of a plurality of commutator cells. The low voltage active mixer function is coupled to an impedance matched amplifier which can be bypassed allowing changes in the gain of the mixer circuit suites while preserving impedance matching.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1:
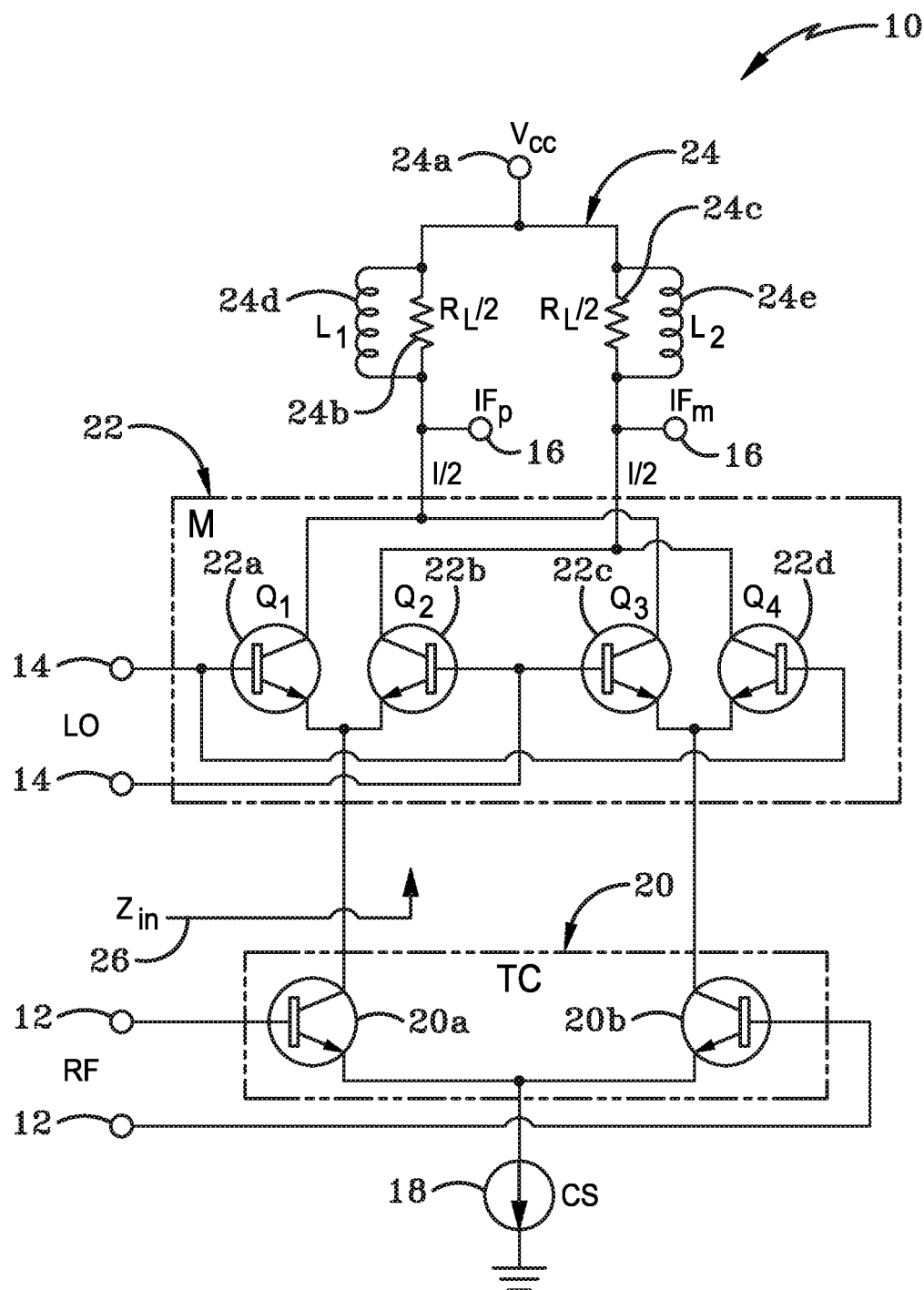
FIG. 1 is a schematic diagram of a PRIOR ART Gilbert cell mixer.

FIG. 1 illustrates a schematic view of a PRIOR ART Gilbert cell mixer 10 which includes a differential voltage radio frequency (RF) input terminal 12, a differential voltage local oscillator (LO) input terminal 14, a differential voltage intermediate frequency (IF) terminal 16, a current source 18, a transconductor 20, a mixing mechanism 22, which may also be referred to as a switching core, commutating quad, mixer core, commutator cell, mixing quad or quad core, and a load mechanism 24.

The transconductor 20 includes a first transistor 20a and a second transistor 20b. The mixing mechanism 22 includes a first transistor 22a, a second transistor 22b, a third transistor 22c and a fourth transistor 22d. The load mechanism 24 includes a voltage supply 24a, a first resistor 24b, a second resistor 24c, a first pull-up inductor 24d and a second pull up inductor 24e.

The base of the first transistor 20a is connected to one of the RF input terminals 12 and the base of the second transistor 20b is connected to the other RF input terminal 12. The emitter of the first transistor 20a is connected to the current source 18 and the emitter of the second transistor 20b. The emitter of the second transistor 20b is connected to the current source 18. The collector of the first transistor 20a is connected to the emitters of the first transistor 22a and the second transistor 22b. The collector of the second transistor 20a is connected to the emitter of the third transistor 22c and the fourth transistor 22d. The first transistor 22a and the second transistor 22b are a cross-coupled pair of transistors. The emitter of the first transistor 22a is connected to the emitter of the second transistor 22b. The third transistor 22c and the fourth transistor 22d are a cross-coupled pair of transistors. The emitter of the third transistor 22c is connected to the emitter of the fourth transistor 22d. The base of the first transistor 22a is connected to the base of the fourth transistor 22d and to one of the LO input terminals 14. The base of the second transistor 22b is connected to the base of the third transistor 22c and the other of the LO input terminals 14. The collector of the first transistor 22a is connected to the collector of the third transistor 22c and to one of the IF output terminals 16. The collector of the second transistor 22b is connected to the collector of the fourth transistor 22d and to the other of the IF output terminals 16. The first resistor 24b and the first pull-up inductor 24d are connected to one of the IF output terminals 16 and the voltage supply 24a. The second resistor 24c and the second pull-up inductor 24e are connected to the other of the IF output terminals 16 and the voltage supply 24a. The PRIOR ART Gilbert cell mixer 10 shows a mixer core impedance 26, or $Z_{in}$, looking into the mixing mechanism 22 and seen by the transconductor 20 across its output terminals.

The operation of the Gilbert cell mixer 10 is well known and, for brevity purposes, will not be discussed herein; however, and as stated in the Background above, the Gilbert cell mixer 10 has some shortcomings.

Figure 2:
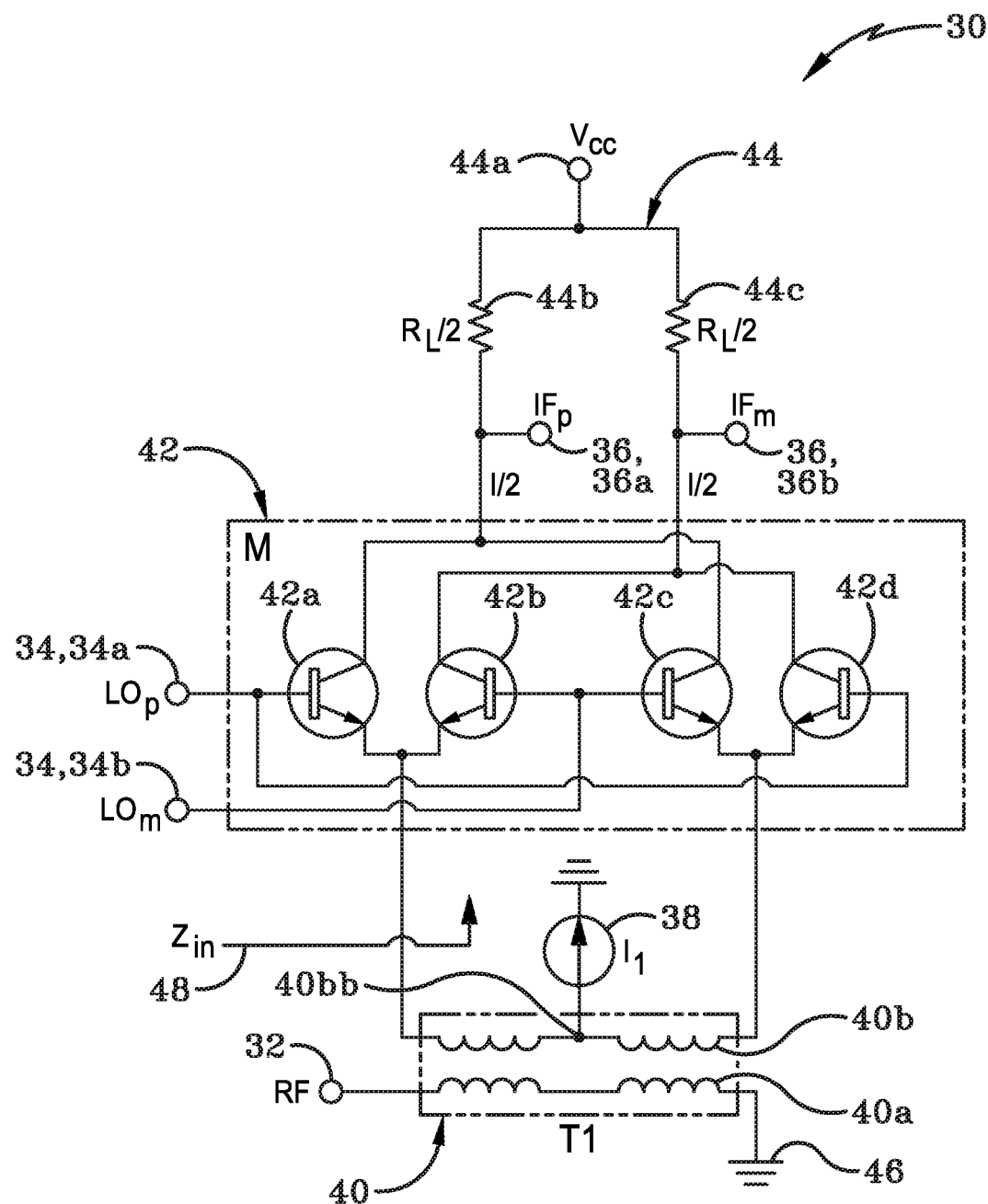
FIG. 2 is a schematic diagram of a PRIOR ART low voltage active RF mixer.

FIG. 2 illustrates a schematic view of a PRIOR ART low voltage active RF mixer 30. The PRIOR ART low voltage active RF mixer 30 removes the transconductor 20 of the PRIOR ART Gilbert Cell mixer 10 while still utilizing the switching core 22 of the PRIOR ART Gilbert Cell mixer 10. Specifically, the PRIOR ART low voltage active RF mixer 30 includes a single-ended RF input terminal 32, a differential voltage LO input terminal 34 having a first LO input terminal 34a and a second LO input terminal 34b, a differential voltage IF output terminal 36 having a first IF output terminal 36a and a second IF output terminal 36b, a current source 38, a transformer 40, a mixing mechanism 42, which may also be referred to as a switching core, mixer core, commutating quad, commutator cell, mixing quad or quad core, a load mechanism 44 and a ground 46.

The transformer 40 includes a primary 40a and a secondary 40b which includes a center tap 40bb. The mixing mechanism 42 includes a first transistor 42a, a second transistor 42b, a third transistor 42c and a fourth transistor 42d. The load mechanism 44 includes a voltage supply 44a, a first resistor 44b and a second resistor 44c.

The primary 40a of the transformer 40 is connected to the RF input terminal 32 and the ground 46. The secondary 40b of the transformer 40 is connected to the emitters of the first transistor 42a, the second transistor 42b, the third transistor 42c and the fourth transistor 42d and the current source 38 via center tap 40*bb*. The first transistor 42*a* and the second transistor 42*b* are a cross-coupled pair of transistors. The emitter of the first transistor 42*a* is connected to the emitter of the second transistor 42*b*. The third transistor 42*c* and the fourth transistor 42*d* are a cross-coupled pair of transistors. The emitter of the third transistor 42*c* is connected to the emitter of the fourth transistor 42*d*. The base of the first transistor 42*a* is connected to the base of the fourth transistor 42*d* and to the first LO input terminal 34*a*. The base of the second transistor 42*b* is connected to the base of the third transistor 42*c* and to the second LO input terminal 34*b*. The collector of the first transistor 42*a* is connected to the collector of the third transistor 42*c* and to the first IF output terminal 36*a*. The collector of the second transistor 42*b* is connected to the collector of the fourth transistor 42*d* and to the second IF output terminal 36*b*. The first resistor 44*b* is connected to the first IF output terminal 36*a* and the voltage supply 44*a*. The second resistor 44*c* is connected to the second IF output terminal 36*b* and the voltage supply 44*a*. The low voltage active RF mixer 30 further shows a mixing mechanism impedance 48, or $Z_{in}$, looking into the mixing mechanism 42 and seen by the transformer 40 across its output terminals.

In operation, an RF input signal (not shown) is split by the transformer 40 and fed to the mixer core 42 which is driven by the LO input terminal 34. In this embodiment, the transformer 40 is a 1:1 planar transformer (which is a transformer that has a ratio of 1 to 1 between the primary and secondary windings). The center tap 40*bb* of the secondary 40*b* of the transformer 40 is used to connect a tail current source $I_1$ to be provided to the mixer core 42. The RF input signal is then down-converted to a desired IF. In one exemplary embodiment, the PRIOR ART low voltage active RF mixer 30 was operated with a 3 milliamp (mA) and a 2.0 volt (V) voltage supply. When the PRIOR ART low voltage active RF mixer 30 is operated at this level of direct current (DC), the input impedance at the RF input terminal 32 is approximately 50 ohms (Ω). As stated above, a 1:1 planar transformer is used to couple the input power to the mixer core 42. Further, when the PRIOR ART low voltage active RF mixer 30 is operated at 3 mA of DC, the PRIOR ART low voltage active RF mixer 30 has an 11 decibel (dB) noise figure, a 2.5 decibel-milliwatts (dBm) input power level (IIP3) and a 6.0 dB gain.

Figure 3:
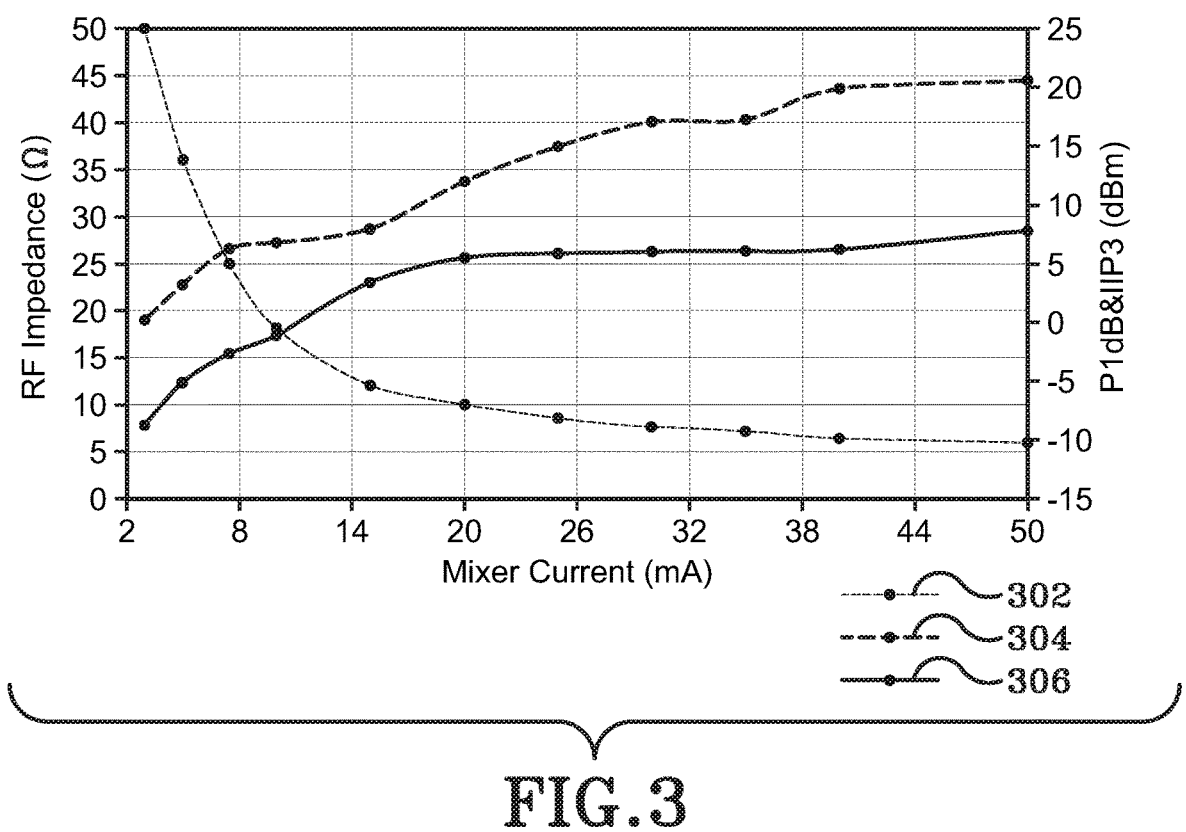
FIG. 3 is a graph of RF impedance and power handling as a function of DC for a low voltage bipolar junction transistor quad mixer.

One drawback associated with the PRIOR ART low voltage active RF mixer 30 is its limited power handling ability as shown in FIG. 3. FIG. 3 is a graph of RF impedance and power handling as a function of DC for a low voltage bipolar junction transistor quad RF mixer which encompasses the PRIOR ART RF mixers 10, 30 and 50 (below) as well as the embodiments of the RF mixers of the present disclosure (below). The left y-axis is RF impedance in Ω, the right y-axis is 1 dB compression point (P1db) in dBm and input power level (IIP3) in dBm and the x-axis is mixer current in mA. Line 302 represents the RF impedance, line 304 represents the IIP3, and line 306 represents P1db. As shown in FIG. 3, as the mixer current increases, the RF impedance of the mixer core decreases according to:

$$Z_{in} = \frac{2\pi(0.026)}{I_{DC}}. \quad \text{Equation (1)}$$

As shown in FIG. 3, the RF impedance of the PRIOR ART low voltage active RF mixer 30 is 50Ω at 3 mA and decreases as the mixer current increases. As shown in FIG. 3, the RF impedance can be as low as 6Ω (including transformer loss) at 50 mA DC when the PRIOR ART low voltage active RF mixer 30 yields 20 dBm IIP3.

Figure 4:
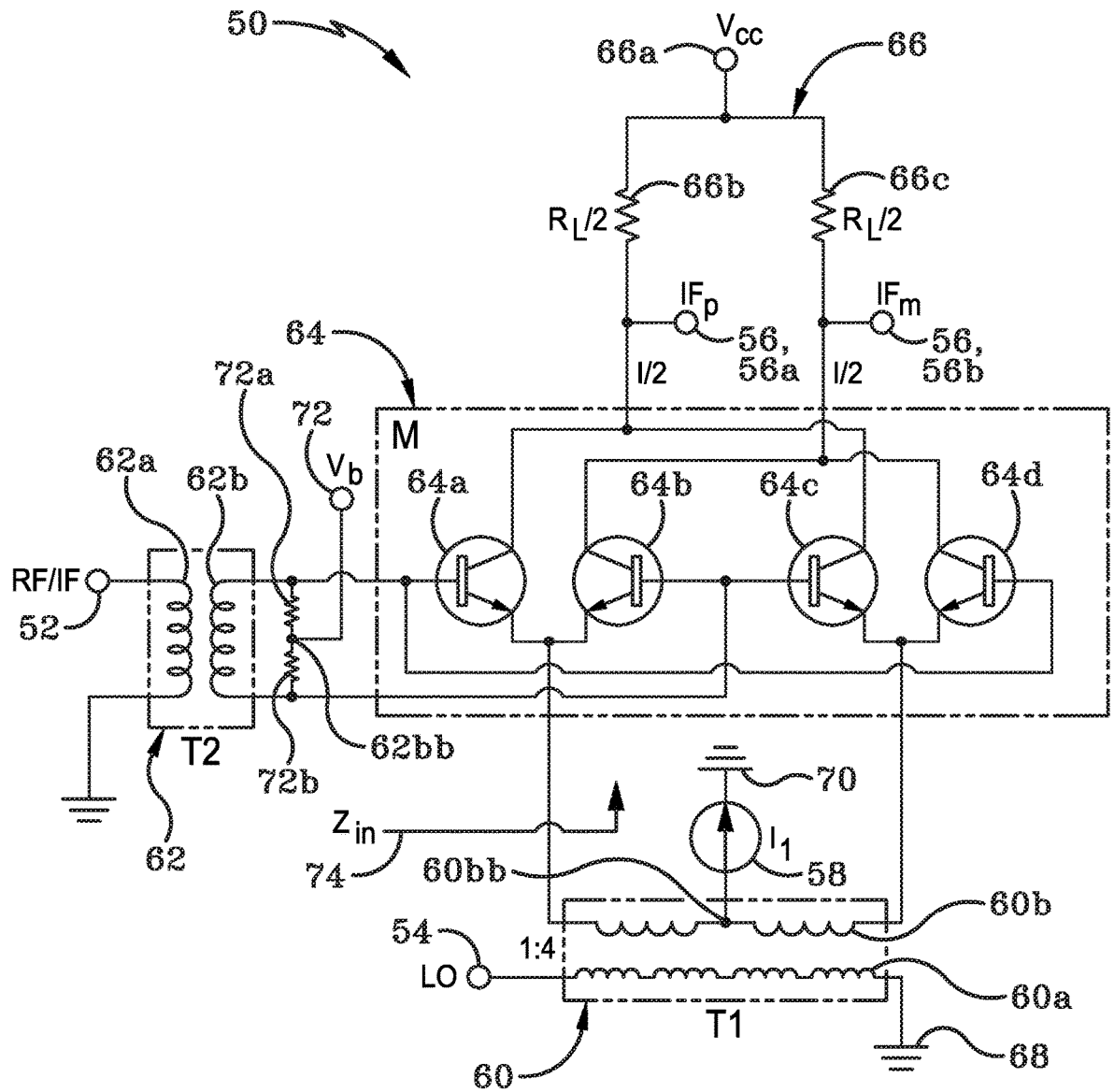
FIG. 4 is a schematic diagram of a PRIOR ART low voltage active RF mixer.

FIG. 4 illustrates a schematic view of a PRIOR ART low voltage active RF mixer 50. The PRIOR ART low voltage active RF mixer 50 is substantially identical to the PRIOR ART low voltage active RF mixer 30 in structure and function with a few exceptions/additions that will be discussed hereafter in greater detail. The PRIOR ART low voltage active RF mixer 50 was designed for 2.5 gigahertz (GHz) low-voltage mobile phone applications and the mixer quad is driven by the emitter side and the RF input signal is fed to the base terminals of the mixer quad as more fully described below. Specifically, PRIOR ART low voltage active RF mixer 50 includes a single-ended RF input terminal 52, a single-ended local oscillator (LO) input terminal 54, a differential voltage IF output terminal 56 having a first IF output terminal 56*a* and a second IF output terminal 56*b*, a current source 58, a first transformer 60, a second transformer 62, a mixing mechanism 64, which may also be referred to as a switching core, mixer core, commutating quad, commutator cell, mixing quad or quad core, a load mechanism 66, a first ground 68, a second ground 70 and a voltage bias circuit 72.

The first transformer 60 includes a primary 60*a* and a secondary 60*b*. The second transformer 62 includes a primary 62*a* and a secondary 62*b* which includes a center tap 62*bb*. The mixing mechanism 64 includes a first transistor 64*a*, a second transistor 64*b*, a third transistor 64*c* and a fourth transistor 64*d*. The load mechanism 66 includes a voltage supply 66*a*, a first resistor 66*b* and a second resistor 66*c*. The voltage bias circuit 72 includes a first resistor 72*a* and a second resistor 72*b*.

The primary 60*a* of the first transformer 60 is connected to the RF input terminal 52 and the first ground 68. The secondary 60*b* of the first transformer 60 is connected the base of the first transistor 64*a*, the base of the second transistor 64*b*, the base of the third transistor 64*c*, the first resistor 72*a* and the second resistor 72*b*. The primary 62*a* of the second transformer 62 is connected to the LO input terminal 54 and the second ground 70. The secondary 62*b* of the second transformer 62 is connected to the emitters of the first transistor 64*a*, the second transistor 64*b*, the third transistor 64*c* and the fourth transistor 64*d* and the current source 58 via center tap 62*bb*. The voltage bias circuit 72 is connected midway between the first resistor 72*a* and the second resistor 72*b*. The first resistor 72*a* is connected to the base of the first transistor 64*a* and the secondary 60*b* of the first transformer 60. The second resistor 72*b* is connected to the base of the second transistor 64*b*, the base of the third transistor 64*c* and the secondary 60*b* of the first transformer 60. The first transistor 64*a* and the second transistor 64*b* are a cross-coupled pair of transistors. The emitter of the first transistor 64*a* is connected to the emitter of the second transistor 64*b*. The third transistor 64*c* and the fourth transistor 64*d* are a cross-coupled pair of transistors. The emitter of the third transistor 64*c* is connected to the emitter of the fourth transistor 64*d*. The base of the first transistor 64*a* is connected to the base of the fourth transistor 64*d* and to the single-ended RF input terminal 52. The base of the second transistor 64*b* is connected to the base of the third transistor 64*c* and to the single-ended RF input terminal 52. The collector of the first transistor 64*a* is connected to the collector of the third transistor 64*c* and to the first IF output terminal 56*a*. The collector of the second transistor 64*b* is connected to the collector of the fourth transistor 64*d* and to the second IF output terminal 56*b*. The first resistor 66*b* is connected to the first IF output terminal 56a and the voltage supply 66a. The second resistor 66c is connected to the second IF output terminal 56b and the voltage supply 66a. The low voltage active RF mixer 50 further includes a mixing mechanism impedance 74, or $Z_{in}$, looking into the mixing mechanism 64 and seen by the single-ended LO input terminal 54.

In operation, an RF input signal (not shown) is fed to the mixer core 64 (i.e. at the bases of the first transistor 64a, second transistor 64b, third transistor 64c and the fourth transistor 64d) which is driven by the LO input terminal 34 (i.e. at the emitters of the first transistor 64a, second transistor 64b, third transistor 64c and the fourth transistor 64d). In this embodiment, the transformer 60 is a 1:4 planar transformer. The center tap 60bb of the secondary 60b of the transformer 60 is used to connect a tail current source $I_1$ to be provided to the mixer core 64. The RF input signal is then down-converted to a desired IF. In one exemplary embodiment, the PRIOR ART low voltage active RF mixer 50 was operated with a 15 mA current with a 2.75 V voltage supply. When the PRIOR ART low voltage active RF mixer 50 is operated at this level of DC, the input impedance at the LO terminal input terminal 54 is low (i.e. approximately 12Ω). Further, when the PRIOR ART low voltage active RF mixer 50 is operated at this level of DC, the PRIOR ART low voltage active RF mixer 50 has a 7.5 dB noise figure, a 2.5 dBm IIP3 and a 14.0 dB gain. As stated above, the low impedance seen by the LO input terminal 54 port requires the driver of the mixer core 64 to handle a 1:4 (i.e. 12 Ω: 48Ω) impedance transformation. Further, the driver consumes 17.5 mA with a 2.75 V supply. Any increase of DC through the mixer core 64 to achieve a higher IIP3 will result in larger transformation ratios for impedance transformation at the drive port (i.e. LO input terminal 54) as shown in the graph of FIG. 3. In other words, a lower impedance seen by the LO input terminal 54 results in a higher driver current requirement.

Figure 5:
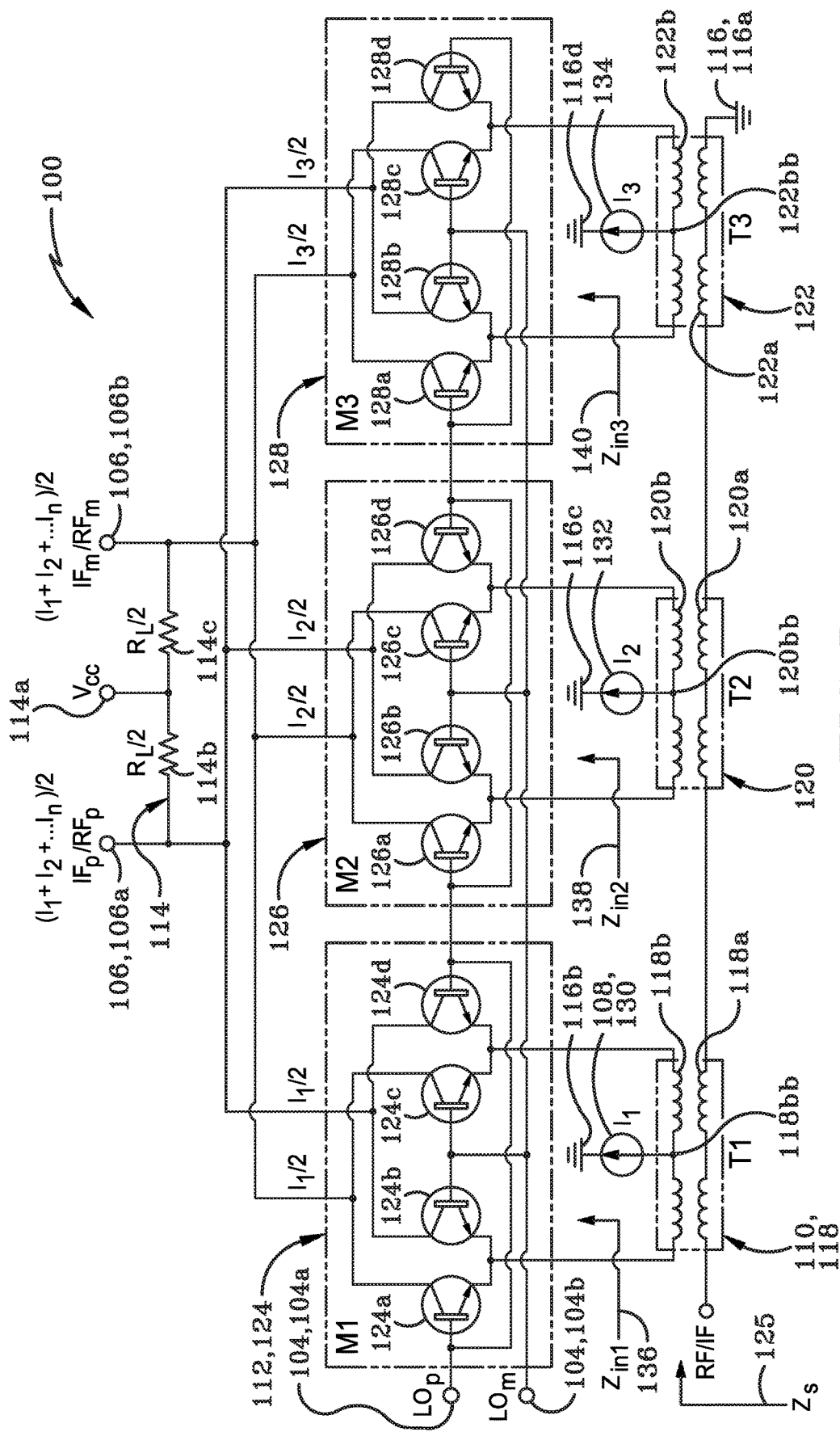
FIG. 5 is a schematic diagram of one embodiment of an active RF mixer apparatus in accordance with one aspect of the present disclosure.

FIG. 5 is a schematic view of one embodiment of an active RF mixer apparatus 100 in accordance with one aspect of the present disclosure. The active RF mixer apparatus 100 may include a single-ended RF input terminal 102, a differential voltage LO input terminal 104 having a first LO input terminal 104a and a second LO input terminal 104b, a differential IF output terminal 106 having a first IF output terminal 106a and a second IF output terminal 106b, at least two current sources 108, at least two transformers 110, at least two mixing mechanisms 112, which may also be referred to as commutator switching cores, mixer cores, commutating quads, mixing quads or quad cores, a load mechanism 114 and at least one ground 116.

In one particular embodiment, the RF mixer apparatus 100 may include a first ground 116a, a second ground 116b, a third ground 116c and a fourth ground 116d.

In one particular embodiment, the active RF mixer apparatus 100 may include a first transformer 118, a second transformer 120 and a third transformer 122. The first transformer 118 may include a primary 118a and a secondary 118b which includes a center tap 118bb. The second transformer 120 may include a primary 120a and a secondary 120b which includes a center tap 120bb. The third transformer 122 may include a primary 122a and a secondary 122b which includes a center tap 122bb. In one example, the first transformer 118, the second transformer 120 and the third transformer 122 are 1:1 planar transformers; however, any suitable transformers may be utilized.

In one particular embodiment, the active RF mixer apparatus 100 may include a first commutator cell 124, a second commutator cell 126 and a third commutator cell 128. The first commutator cell 124 may include a first transistor 124a, a second transistor 124b, a third transistor 124c and a fourth transistor 124d. The second commutator cell 126 may include a first transistor 126a, a second transistor 126b, a third transistor 126c and a fourth transistor 126d. The third commutator cell 128 may include a first transistor 128a, a second transistor 128b, a third transistor 128c and a fourth transistor 128d. In one example, the first commutator cell 124, the second commutator cell 126 and the third commutator cell 128 may be a bipolar junction transistor mixer; however the first commutator cell 124, the second commutator cell 126 and the third commutator cell 128 may be any suitable mixing mechanism. Further, the first commutator cell 124, the second commutator cell 126 and the third commutator cell 128 may utilize any suitable transistors including, but not limited to, bipolar transistors, n-type field effect transistors (nFETs), pseudomorphic high-electron mobility transistors (pHEMTs), metal-semiconductor field-effect transistors (MESFETs) and gallium nitride (GaN) transistors.

The load mechanism 114 may include a voltage supply 114a, a first resistor 114b and a second resistor 114c. Although not shown, it is envisioned that the load mechanism 114 may further include a first pull-up inductor and a second pull-up inductor.

In one particular embodiment, the active RF mixer apparatus 100 may include a first current source 130, a second current source 132 and a third current source 134.

In one example, the primary 118a of the first transformer 118 is connected to the RF input terminal 102 and the primary 120a of the second transformer 120 in series. The primary 120a of the second transformer 120 is connected to the primary 122a of the third transformer 122 in series. The primary of the third transformer 122a is connected to the first ground 116a.

The secondary 118b of the first transformer 118 is connected to the emitters of the first transistor 124a, the second transistor 124b, the third transistor 124c and the fourth transistor 124d of the first commutator cell 124 and the first current source 130 via center tap 118bb. The first current source 130 is connected to the second ground 116b. The first transistor 124a and the second transistor 124b are a cross-coupled pair of transistors. The emitter of the first transistor 124a is connected to the emitter of the second transistor 124b. The third transistor 124c and the fourth transistor 124d are a cross-coupled pair of transistors. The emitter of the third transistor 124c is connected to the emitter of the fourth transistor 124d. The base of the first transistor 124a is connected to the base of the fourth transistor 124d and to the first LO input terminal 104a. The base of the second transistor 124b is connected to the base of the third transistor 124c and to the second LO input terminal 104b. The collector of the first transistor 124a is connected to the collector of the third transistor 124c and to the first IF output terminal 106a. The collector of the second transistor 124b is connected to the collector of the fourth transistor 124d and to the second IF output terminal 106b. The first resistor 114b is connected to the first IF output terminal 106a and the voltage supply 114a. The second resistor 114c is connected to the second IF output terminal 106bb and the voltage supply 114a. The active RF mixer apparatus 100 further shows a first commutator cell impedance 136, or $Z_{in1}$, looking into the first commutator cell 124 and seen by the first transformer 118, which is a 1:1 transformer, across its primary 118a terminals.

The secondary 120b of the second transformer 120 is connected to the emitters of the first transistor 126a, the second transistor 126b, the third transistor 126c and the fourth transistor 126d of the second commutator cell 126 and the first current source 132 via center tap 120bb. The second current source 132 is connected to third ground 116c. The first transistor 126a and the second transistor 126b are a cross-coupled pair of transistors. The emitter of the first transistor 126a is connected to the emitter of the second transistor 126b. The third transistor 126c and the fourth transistor 126d are a cross-coupled pair of transistors. The emitter of the third transistor 126c is connected to the emitter of the fourth transistor 126d. The base of the first transistor 126a is connected to the base of the fourth transistor 126d and to the first LO input terminal 104a in parallel. The base of the second transistor 126b is connected to the base of the third transistor 126c and to the second LO input terminal 104b in parallel. The collector of the first transistor 126a is connected to the collector of the third transistor 126c and to the first IF output terminal 106a in parallel. The collector of the second transistor 126b is connected to the collector of the fourth transistor 126d and to the second IF output terminal 106b in parallel. The active RF mixer apparatus 100 further shows a second commutator cell impedance 138, or $Z_{in2}$, looking into the second commutator cell 126 and seen by the second transformer 120, which is a 1:1 transformer, across its primary 120a terminals.

The secondary 122b of the second transformer 122 is connected to the emitters of the first transistor 128a, the second transistor 128b, the third transistor 128c and the fourth transistor 128d of the third commutator cell 128 and the third current source 134 via center tap 122bb. The third current source 134 is connected to the fourth ground 116d. The first transistor 128a and the second transistor 128b are a cross-coupled pair of transistors. The emitter of the first transistor 128a is connected to the emitter of the second transistor 128b. The third transistor 128c and the fourth transistor 128d are a cross-coupled pair of transistors. The emitter of the third transistor 128c is connected to the emitter of the fourth transistor 128d. The base of the first transistor 128a is connected to the base of the fourth transistor 128d and to the first LO input terminal 104a in parallel. The base of the second transistor 128b is connected to the base of the third transistor 128c and to the second LO input terminal 104b in parallel. The collector of the first transistor 128a is connected to the collector of the third transistor 128c and to the first IF output terminal 106a in parallel. The collector of the second transistor 128b is connected to the collector of the fourth transistor 128d and to the second IF output terminal 106b in parallel. The active RF mixer apparatus 100 further shows a second commutator cell impedance 140, or $Z_{in3}$, looking into the third commutator cell 128 and seen by the third transformer 122, which is a 1:1 transformer, across its primary 122a terminals.

In operation, an RF input signal (not shown) is split by the first transformer 118, the second transformer 120 and the third transformer 122 and fed to the first commutator cell 124, the second commutator cell 126 and the third commutator cell 128. The first commutator cell 124, the second commutator cell 126 and the third commutator cell 128 are driven by the LO input terminal 104. The first commutator cell 124, the second commutator cell 126 and the third commutator cell 128 each have a bias current from the first current source 130, the second current source 132 and the third current source 134 shown as $I_1$, $I_2$ and $I_3$ in FIG. 5. In one example, $I_1$, $I_2$, and $I_3$ are equal and are each one third of the total commutator cell DC. The RF input signal is down-converted to a desired IF signal. The outputs of the first commutator cell 124, the second commutator cell 126 and the third commutator cell 128 are connected in parallel combining the currents of the first commutator cell 124, the second commutator cell 126 and the third commutator cell 128.

In one example, the architecture of the active RF mixer 100 apparatus simultaneously provides improved power handling and improved impedance matching compared to conventional active RF mixers including the PRIOR ART mixers 10, 30 and 50. In one example, the architecture allows the active RF mixer 100 apparatus to operate with larger DC while increasing the input intercept point (IIP3) and the 1 dB compression point (P1db). The IIP3 represents how efficiently an active RF mixer processes signals without distortion. In other words, the IIP3 is a figure of merit for a RF/microwave radio component. The IIP3 also represents how much of a range, for example, power in milliwatts or dBms, that the component is able to suitably process without distortion. The P1db is defined as the input power at which the insertion loss has increased by 1 dB from its low-power value. In other words, the P1db is a measure of the amount of power that can be input to the active RF mixer at the input port before the output power deviates from a linear relationship with the input power by 1 dB.

More specifically, and in one example, the improved power handling and improved impedance matching is accomplished by splitting the total DC (I) equally (I/3) between the first commutator cell 124, the second commutator cell 126 and the third commutator cell 128. An RF source impedance 125, or $Z_s$, is presented to the RF input terminal 102. The total commutator cell impedance, which is the sum of the first commutator cell impedance $Z_{in1}$, the second commutator cell impedance $Z_{in2}$ and the third commutator cell impedance $Z_{in3}$, is matched to the RF source impedance $Z_s$. In one example, the individual commutator cell impedance $$\left(\propto \frac{3}{I}\right)$$

is three times greater than the total commutator cell impedance of the PRIOR ART active RF mixers 10, 30 and 50. The RF impedances of each commutator cell 124, 126 and 128 are additively summed at the RF input terminal 102 by 1:1 transformers 118, 120 and 122 whose primaries 118a, 120a, and 122a are connected in series which provides a total RF impedance that is nine times greater than the RF impedances presented by the PRIOR ART active RF mixers 10, 30 and 50. The impedance transformation is accomplished, at least in part, by current splitting between three commutator cells and using 1:1 transformers. A 1:1 transformer has a stronger magnetic coupling factor k with equal primary and secondary turns compared to other transformers, such as a 1:4 transformer. This minimizes leakage flux present in 1:1 transformers and also yields low-loss with improved passive transformation efficiency and broadband matching. Further, the linearity of the active RF mixer apparatus 100 is improved by operating in a higher DC range compared to conventional active RF mixers.

Figure 6:
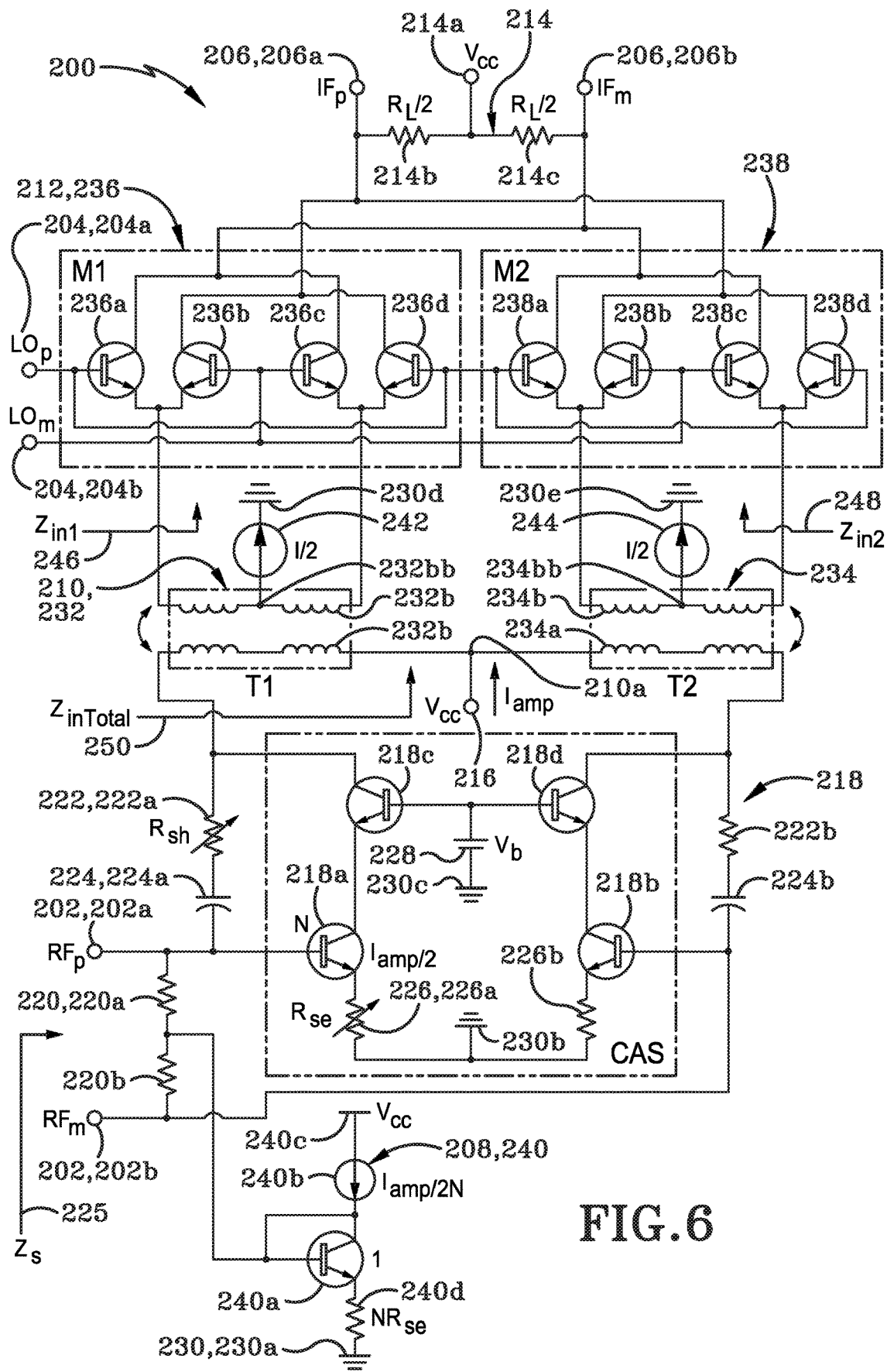
FIG. 6 is a schematic diagram of one embodiment of an active RF mixer apparatus in accordance with one aspect of the present disclosure.

FIG. 6 is a schematic view of one embodiment of an active RF mixer apparatus 200 in accordance with one aspect of the present disclosure. The active RF mixer apparatus 200 may include a differential voltage RF input terminal 202 having a first RF input terminal 202a and a second RF input terminal 202b, a differential voltage local oscillator (LO) input terminal 204 having a first LO input terminal 204a and a second LO input terminal 204b, a differential IF output terminal 206 having a first IF output terminal 206a and a second IF output terminal 206b, at least one current source 208, at least two transformers 210, at least two mixing mechanisms 212, which may also be referred to as commutator switching cores, mixer cores, commutating quads, mixing quads or quad cores, a load mechanism 214, at least one voltage supply 216, an amplifier mechanism 218, at least one isolation resistor 220, at least one shunt resistor 222, at least one shunt capacitor 224, at least one emitter resistor 226, a voltage bias circuit 228 and at least one ground 230.

In one particular embodiment, the active RF mixer apparatus 200 may include a first ground 230a, a second ground 230b, a third ground 230c, a fourth ground 230d and a fifth ground 230e.

In one particular embodiment, the active RF mixer apparatus 200 may include a first transformer 232 and a second transformer 234. The first transformer 232 may include a primary 232a and a secondary 232b which includes a center tap 232bb. The second transformer 234 may include a primary 234a and a secondary 234b which includes a center tap 234bb. In one example, the first transformer 232 and the second transformer 234 are 1:1 planar transformers; however, any suitable transformers may be utilized.

In one particular embodiment, the active RF mixer apparatus 200 may include a first commutator cell 236 and a second commutator cell 238. The first commutator cell 236 may include a first transistor 236a, a second transistor 236b, a third transistor 236c and a fourth transistor 236d. The second commutator cell 238 may include a first transistor 238a, a second transistor 238b, a third transistor 238c and a fourth transistor 238d. In one example, the first commutator cell 236 and the second commutator cell 238 may be a bipolar junction transistor mixer; however the first commutator cell 236 and the second commutator cell 238 may be any suitable mixing mechanism. Further, the first commutator cell 236 and the second commutator cell 238 may utilize any suitable transistors including, but not limited to, bipolar transistors, n-type field effect transistors (nFETs), pseudomorphic high-electron mobility transistors (pHEMTs), metal-semiconductor field-effect transistors (MESFETs) and gallium nitride (GaN) transistors.

The load mechanism 214 may include a voltage supply 214a, a first resistor 214b and a second resistor 214c. Although not shown, it is envisioned that the load mechanism 214 may further include a first pull-up inductor and a second pull-up inductor.

In one particular embodiment, the active RF mixer apparatus 200 may include a first current source 240, a second current source 242 and a third current source 244. The first current source 240 may be a current mirror including a diode connected transistor 240a, a reference current 240b and a voltage supply 240c. The reference current 240b is scaled ($I_{amp}$/2N) to represent the transistor size ratio 1:N between the diode connected transistor 240a, the first transistor 218a and the second transistor 218b. The diode connected transistor 240a may include an emitter resistor 240d, or $NR_{se}$, connected to ground 230a.

In one particular embodiment, the active RF mixer apparatus 200 may include a first isolation resistor 220a and a second isolation resistor 220b.

In one particular embodiment, the active RF mixer apparatus 200 may include a first shunt resistor 222a, a second shunt resistor 222b, a first shunt capacitor 224a and a second shunt capacitor 224b.

In one particular embodiment, the active RF mixer apparatus 200 may include a first emitter resistor 226a and a second emitter resistor 226b.

In one particular embodiment, the amplifier mechanism 218 may include a first transistor 218a, a second transistor 218b, a third transistor 218c and a fourth transistor 218d. The first transistor 218a and the third transistor 218c may be a common-base transistor pair and the second transistor 218b and the fourth transistor 218d may be a common-emitter transistor pair.

In one particular embodiment, the amplifier mechanism 218 may be a series-shunt feedback amplifier formed by the first shunt resistor 222a the second shunt resistor 222b, the first shunt capacitor 224a, the second shunt capacitor 224b, the first emitter resistor 226a and the second emitter resistor 226b and the amplifier mechanism 218; however, the amplifier mechanism 218 may be any suitable amplifier mechanism.

In one example, the first RF input terminal 202a is connected to the base of the first transistor 218a. The second RF input terminal 202b is connected to the base of the second transistor 218b. The first isolation resistor 220a and the second isolation resistor 220b may be connected across the differential RF input terminal 202. The first current source 240 may be connected between the first isolation resistor 220a and the second isolation resistor 220b and to the first ground 230a.

The emitter of the first transistor 218a is connected to the emitter of the second transistor 218b and the second ground 230b and the emitter of the second transistor 218b is connected to the second ground 230b. The collector of the first transistor 218a is connected to the emitter of the third transistor 218c. The collector of the second transistor 218b is connected to the emitter of the fourth transistor 218d. The base of the third transistor 218a is connected to the base of the fourth transistor 218d and the voltage bias circuit 228. The voltage bias circuit 228 is connected to the third ground 230c. The collector of the third transistor 218c is connected to the primary 232a of the first transformer 232 and the first shunt resistor 222a. The first shunt capacitor 224a is connected to the first shunt resistor 222a and the base of the second transistor 218b. The collector of the fourth transistor 218d is connected to the primary 234a of the second transformer 234 and the second shunt resistor 222b. The second shunt capacitor 224b is connected to the second shunt resistor 222b and the base of the second transistor 218b.

In one particular embodiment, the primary 232a of the first transformer 232 is connected to the primary 234a of the second transformer 234 in series. The voltage supply 216 is connected between the primary 232a of the first transformer 232 and the primary 234a of the second transformer 234 at a primary tap 210a to provide a voltage to the amplifier mechanism 218.

The secondary 232b of the first transformer 232 is connected to the emitters of the first transistor 236a, the second transistor 236b, the third transistor 236c and the fourth transistor 236d of the first commutator cell 236 and the second current source 242 via center tap 236bb. The second current source 242 is connected to the fourth ground 230d. The first transistor 236a and the second transistor 236b are a cross-coupled pair of transistors. The emitter of the first transistor 236a is connected to the emitter of the second transistor 236b. The third transistor 236c and the fourth transistor 236d are a cross-coupled pair of transistors. The emitter of the third transistor 236c is connected to the emitter of the fourth transistor 236d. The base of the first transistor 236a is connected to the base of the fourth transistor 236d and to the first LO input terminal 204a. The base of the second transistor 236b is connected to the base of the third transistor 236c and to the second LO input terminal 204b. The collector of the first transistor 236a is connected to the collector of the third transistor 236c and to the first IF output terminal 206a. The collector of the second transistor 236b is connected to the collector of the fourth transistor 236d and to the second IF output terminal 206b. The first resistor 214b is connected to the first IF output terminal 206a and the voltage supply 214a. The second resistor 214c is connected to the second IF output terminal 206b and the voltage supply 214a. The active RF mixer apparatus 200 further shows a first commutator cell impedance 246, or $Z_{in1}$, looking into the first commutator cell 236 and seen by the amplifier mechanism 218.

The secondary 234b of the second transformer 234 is connected to the emitters of the first transistor 238a, the second transistor 238b, the third transistor 238c and the fourth transistor 238d of the second commutator cell 238 and the third current source 244 via center tap 238bb. The third current source 244 is connected to the fifth ground 230e. The first transistor 238a and the second transistor 238b are a cross-coupled pair of transistors. The emitter of the first transistor 238a is connected to the emitter of the second transistor 238b. The third transistor 238c and the fourth transistor 238d are a cross-coupled pair of transistors. The emitter of the third transistor 238c is connected to the emitter of the fourth transistor 238d. The base of the first transistor 238a is connected to the base of the fourth transistor 238d and to the first LO input terminal 204a in parallel. The base of the second transistor 238b is connected to the base of the third transistor 238c and to the second LO input terminal 204b in parallel. The collector of the first transistor 238a is connected to the collector of the third transistor 238c and to the first IF output terminal 206a in parallel. The collector of the second transistor 238b is connected to the collector of the fourth transistor 238d and to the second IF output terminal 206b in parallel. The active RF mixer apparatus 200 further shows a second commutator cell impedance 248, or $Z_{in2}$, looking into the second commutator cell 238 and seen by the amplifier mechanism 218. The active RF mixer apparatus 200 further shows a total commutator cell impedance 250, or $Z_{inTotal}$, which is the sum of the first commutator cell impedance $Z_{in1}$ and the second commutator cell impedance $Z_{in2}$, looking into the first commutator cell 236, the second commutator cell 238 and seen by the amplifier mechanism 218.

In operation, an RF input signal (not shown) is amplified by the amplifier mechanism 218. The amplified RF signal is split by the first transformer 232 and the second transformer 234 and fed to the first commutator cell 236 and the second commutator cell 238. The first commutator cell 236 and the second commutator cell 238 are driven by the LO input terminal 204. The first commutator cell 236 and the second commutator cell 238 each operate at half of the total mixer DC I using the second current source 242 and the third current source 244 shown as $I_2$ and $I_3$. The DC in each commutator cell 236 and 238 is half of the total mixer DC which doubles the RF impedance of each cell 236 and 238. The series connection of each cell 236 and 238 through the first transformer 232 and the second transformer 234 further doubles the RF impedance. Therefore, the RF impedance presented to the RF input terminal 202 is four times greater than the RF impedance of the PRIOR ART active RF mixers 10, 30 and 50. The RF input signal is down-converted to a desired IF signal. The outputs of the first commutator cell 236 and the second commutator cell 238 are connected in parallel combining the currents of the first commutator cell 236 and the second commutator cell 238. In one example, an RF source impedance 225, or $Z_s$, is presented to the RF input terminal 202. The total commutator cell impedance, which is the sum of the first commutator cell impedance $Z_{in1}$ and the second commutator cell impedance $Z_{in2}$ is matched to the RF source impedance $Z_s$.

In one example, the architecture of the active RF mixer 200 apparatus simultaneously provides improved power handling and improved impedance matching compared to conventional active RF mixers including the PRIOR ART mixers 10, 30 and 50. In one example, the architecture allows the active RF mixer 200 apparatus to operate with larger DC while increasing the IIP3 and the P1db. Further, the amplifier mechanism 218 of the RF mixer apparatus 200 may be operated on a low voltage supply. Further, the voltage supply 216 allows variation in the amount of current provided to the amplifier mechanism 218. In this embodiment, the output impedance of the amplifier mechanism 218 is matched to the total commutator cell impedance $Z_{inTotal}$ by selecting suitable values of the first shunt resistor 222a, the second shunt resistor 222b, the first emitter resistor 226a and the second emitter resistor 226b. The first shunt capacitor 224a and the second shunt capacitor 224b serve as DC blocks. The first shunt resistor 222a and the second shunt resistor 222b may be varied to tune the output impedance of the amplifier mechanism 218. Further, increasing the RF impedance of the first commutator cell 236 and the second commutator cell 238 at the RF input terminal 202 enables voltage feedback. In one example, variation of shunt resistors 222a and 222b and emitter resistors 226a and 226b may yield various gain values with no effect on the input and output impedances of the amplifier mechanism 218. In one example, the variation of the shunt resistors 222a and 222b and emitter resistors 226a and 226b may be simultaneous. Such flexibility of gain variation while preserving impedance is not taught or disclosed by the PRIOR ART mixers 10, 30 and 50.

Figure 7:
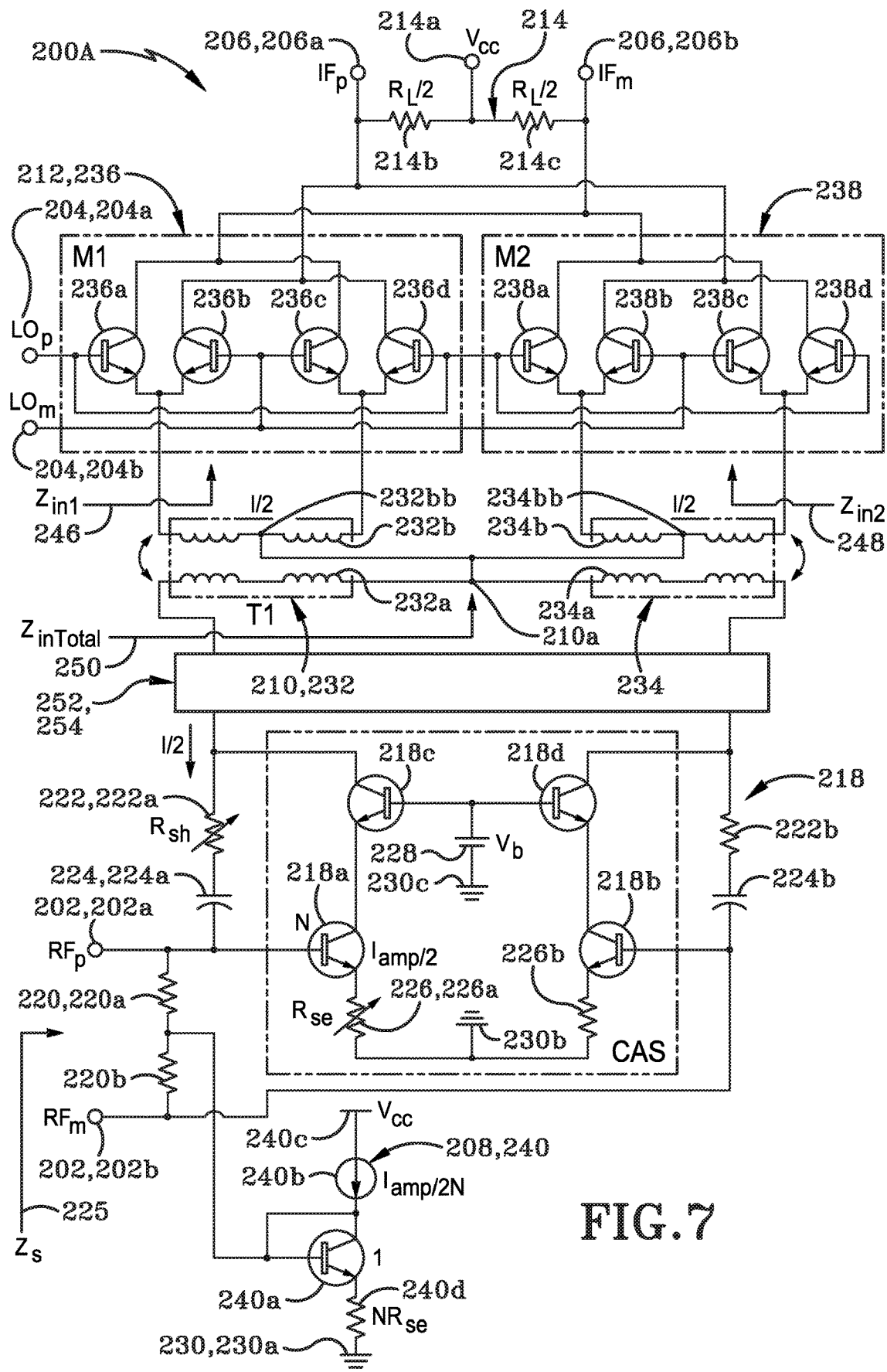
FIG. 7 is a schematic diagram of one embodiment of an active RF mixer apparatus in accordance with one aspect of the present disclosure.

FIG. 7 is a schematic view of one embodiment of an active RF mixer apparatus 200A in accordance with one aspect of the present disclosure. Active RF mixer apparatus 200A is substantially identical to active RF mixer apparatus 200 in structure and function with a few exceptions/additions that will be discussed hereafter in greater detail.

Figure 8:
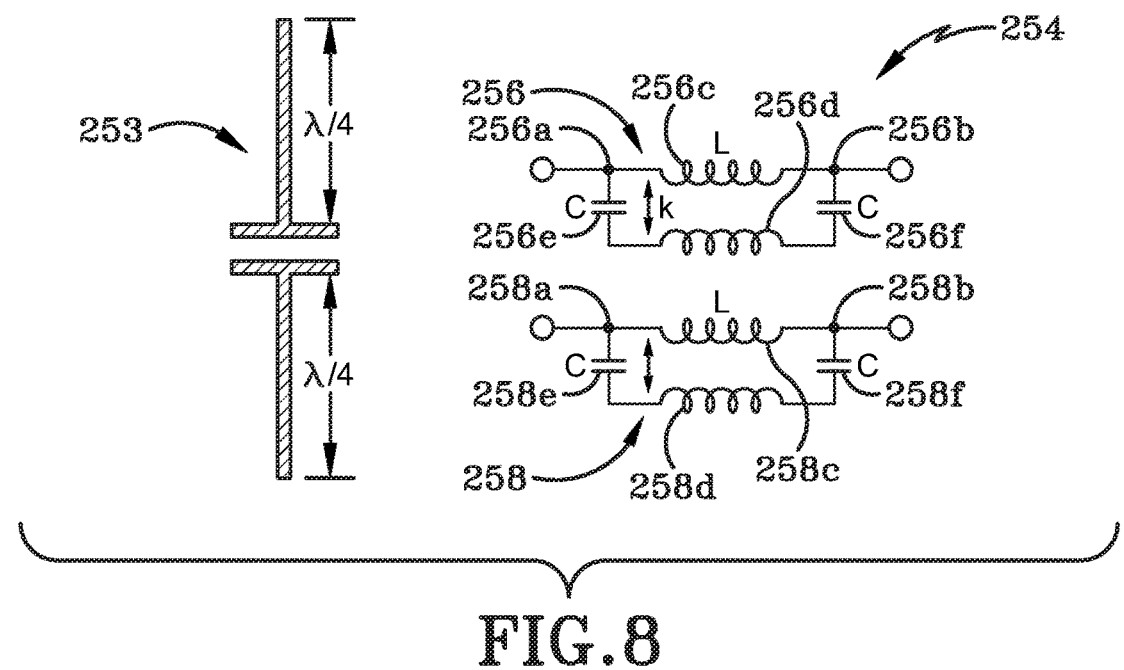
FIG. 8 is a cross-section view of a typical quarter-wave stub and a schematic diagram of a notch filter.

The active RF mixer apparatus 200A may further include a filter mechanism 252. In one example, the filter mechanism may be a quarter-wave stub 253 (FIG. 8) and a notch filter 254 (FIG. 8). The notch filter 254 may include a first portion 256 and a second portion 258. The first portion 256 may include a first node 256a, a second node 256b, a first inductor 256c, a second inductor 256d, a first capacitor 256e and a fourth capacitor 256f. The second portion 258 may include a first node 258a, a second node 258b, a first inductor 258c, a second inductor 258d, a first capacitor 258e and a fourth capacitor 258e.

Instead of the secondary 232b of the first transformer 232 being connected to the emitters of the first transistor 236a, the second transistor 236b, the third transistor 236c and the fourth transistor 236d of the first commutator cell 236 and the second current source 242 via center tap 232bb, the secondary 232b of the first transformer 232 is connected to the emitters of the first transistor 236a, the second transistor 236b, the third transistor 236c and the fourth transistor 236d of the first commutator cell 236 and to the primary tap 210a at the midpoint of the series connection of the primary 232a of the first transformer 232 and the primary 234a of the second transformer 234. This embodiment does not include the voltage supply 216 of the active RF mixer apparatus of 200A.

Instead of the secondary 234b of the second transformer 234 being connected to the emitters of the first transistor 238a, the second transistor 238b, the third transistor 238c and the fourth transistor 238d of the second commutator cell 238 and the second current source 242 via center tap 234bb, the secondary 234b of the second transformer 234 is connected to the emitters of the first transistor 238a, the second transistor 238b, the third transistor 238c and the fourth transistor 238d of the second commutator cell 238 and to the primary tap 210a at the midpoint of the series connection of the primary 232a of the first transformer 232 and the primary 234a of the second transformer 234.

Instead of the collector of the third transistor 218c being connected to the primary 232a of the first transformer 232 and the first shunt resistor 222a, the collector of the third transistor 218c is connected to the first node 256a of the first portion 256 of the notch filter 254 and the first shunt resistor 222a. The primary 232a of the first transformer 232 is connected to the second node 256b of the first portion 256 of the notch filter 254.

Figure 9:
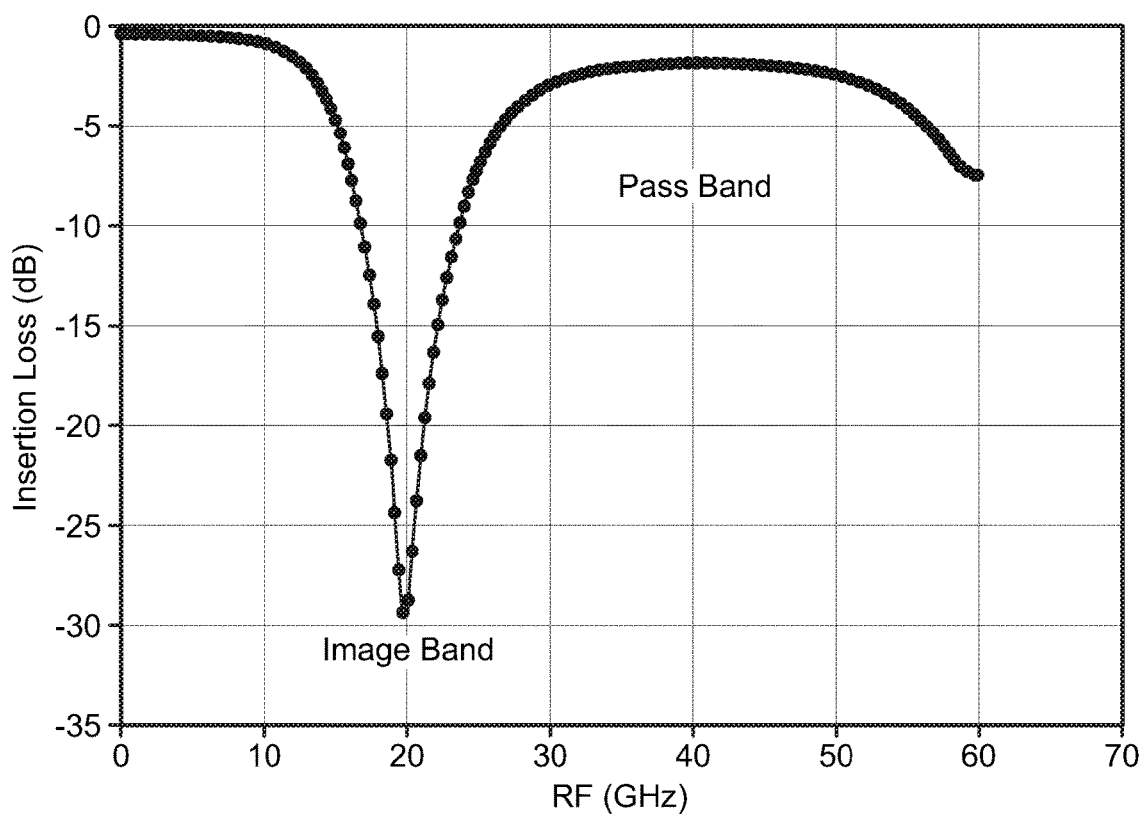
FIG. 9 is a graph of an exemplary image band and pass band of the notch filter.

Instead of the collector of the fourth transistor 218d being connected to the primary 234a of the second transformer 234 and the second shunt resistor 222b, the collector of the fourth transistor 218d is connected to the first node 258a of the second portion 258 of the notch filter 254 and the second shunt resistor 222b. The primary 234a of the second transformer 234 is connected to the second node 258b of the second portion 258 of the notch filter 254. Further, the voltage supply 216 has been removed. FIG. 9 depicts an exemplary image band and pass band of the notch filter 254.

In operation, the active RF mixer apparatus 200A operates in a substantially identical manner to active RF mixer apparatus 200, except that the amplifier mechanism 218 of the active RF mixer apparatus 200A receives supply a voltage through the primary tap 210a allowing the amplifier mechanism 218 to reuse the total commutator cell current through the primary tap 210a and the active RF mixer apparatus 200A has a further reduction in the noise figure compared to the active RF mixer apparatus 200. Impedance matching the amplifier mechanism 218 to the total commutator cell impedance $Z_{inTotal}$ increases the amplifier gain ($G_{amp}$). This allows the noise reduction as described in greater detail herein. The contribution of the first commutator cell 236 and the second commutator cell 238 to the noise figure is reduced by the increased gain of the amplifier mechanism 218 in accordance with the Friis Formula:

$$F_T = F_{amp} + \frac{F_{mix} - 1}{G_{amp}}. \qquad \text{Equation (2)}$$

As stated above, the noise figure reduction is accomplished, at least in part, by the impedance transformation of the commutating elements (i.e. the first commutator cell 236 and the second commutator cell 238) to the amplifier mechanism 218. The noise figure is further reduced by filtering the image noise amplified by the amplifier mechanism 218. In one example, at millimeter-wave frequencies, open half-wave length stubs may be used. Impedance band stop filters may also be added or inserted at the output of the amplifier mechanism 218. In one example, at millimeter-wave frequencies, miniature coupled split resonators may be used. At higher RF and microwave frequencies, transformer coupled filters may be used. The noise figure of the active RF mixer apparatus may be reduced by as much as 3 dB when compared to conventional RF mixers including the PRIOR ART Gilbert cell mixer 10.

In one exemplary implementation of the active RF mixer apparatus 200A, the first commutator cell 236 and the second commutator cell 238 may be connected with the amplifier mechanism 218 designed as a cascode amplifier. In this exemplary implementation, the first commutator cell 236 and the second commutator cell 238 provide a gain of −2.5 dB with a noise figure of 10 dB. The first and second shunt resistor 222a and 222b of the cascode amplifier may have a value of 800 and the first and second emitter resistor 226a and 226b may have a value of 2Ω to provide a gain of 12 dB with a noise figure of 2.6 dB. Therefore, the overall noise figure in terms of gain $G_{amp}$ and noise factor $F_{mix}$—is provided by Equation 2 and is equal to 3.8 dB. However, without rejection of the image noise, the value is equal to 3.8 plus 3 which is equal to 6.8 dB. Therefore, any rejection of the image noise will reduce the overall noise contributed by the mixing process. If IR is the image noise rejection in dB, then the noise figure degradation can be expressed as follows:

$$NF_{DG} = \left[10 \log_{10}\left(1 + 10^{\frac{-IR}{10}}\right)\right] \text{dB}. \qquad \text{Equation (3)}$$

Figure 10:
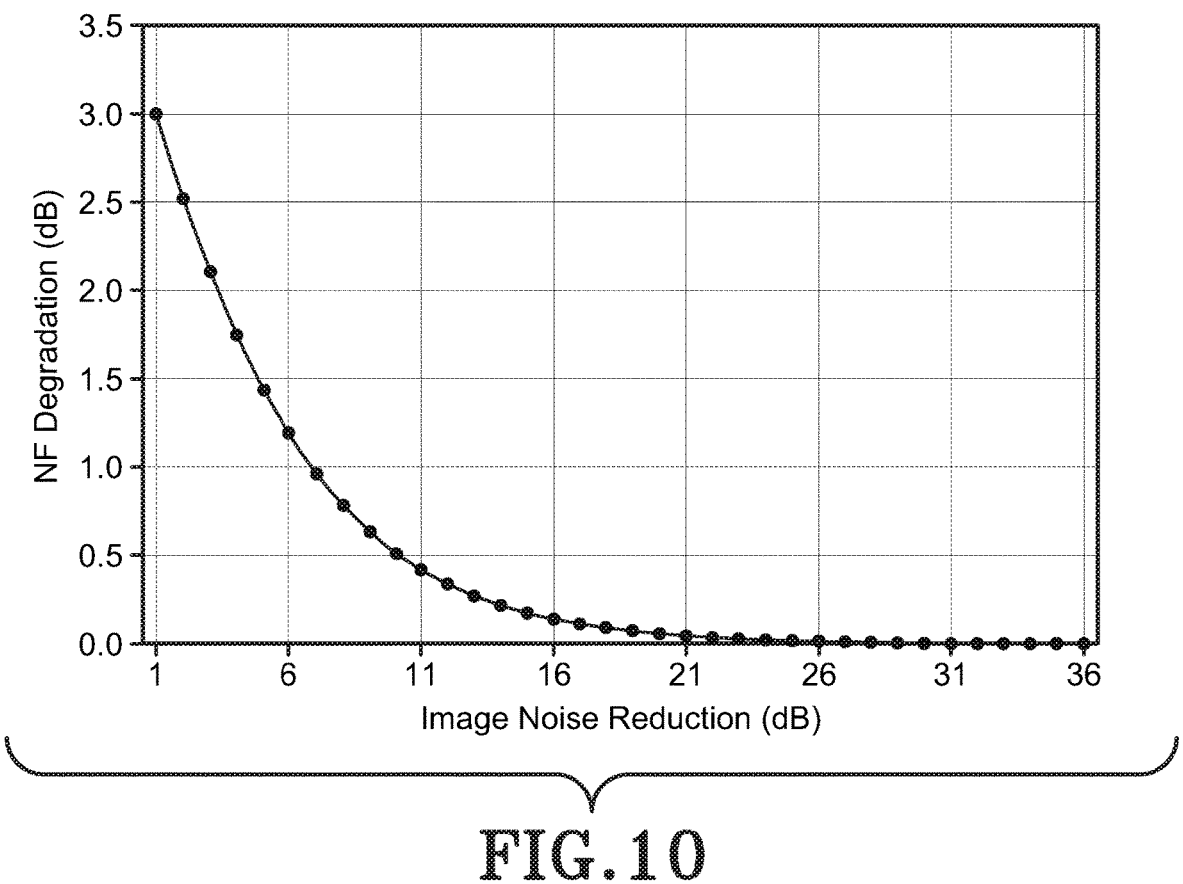
FIG. 10 is a graph of noise figure degradation in decibels (dB) as a function of image noise rejection in dB.

With no rejection of the image noise into the mixing element (i.e. the first commutator cell 236 and the second commutator cell 238), the noise figure degrades by 3 dB. In one example, an exemplary transformer notch (one stage) and a quarter-wave microstrip stub may be utilized to realize 15 dB of image noise rejection. In accordance with Equation (3), the noise figure of the amplifier mechanism 218 and the at least two mixing mechanisms 212 cascade degrades by 0.14 dB. The cascade noise figure is 3.8+0.14=3.94 dB. With improved power gain and reduced noise figure accomplished by techniques as described herein, a low-noise-amplifier (LNA) function may be replaced within the modified Gilbert cell mixer structure. FIG. 10 depicts noise figure degradation in dB as a function of image noise reduction in dB.

Figure 11:
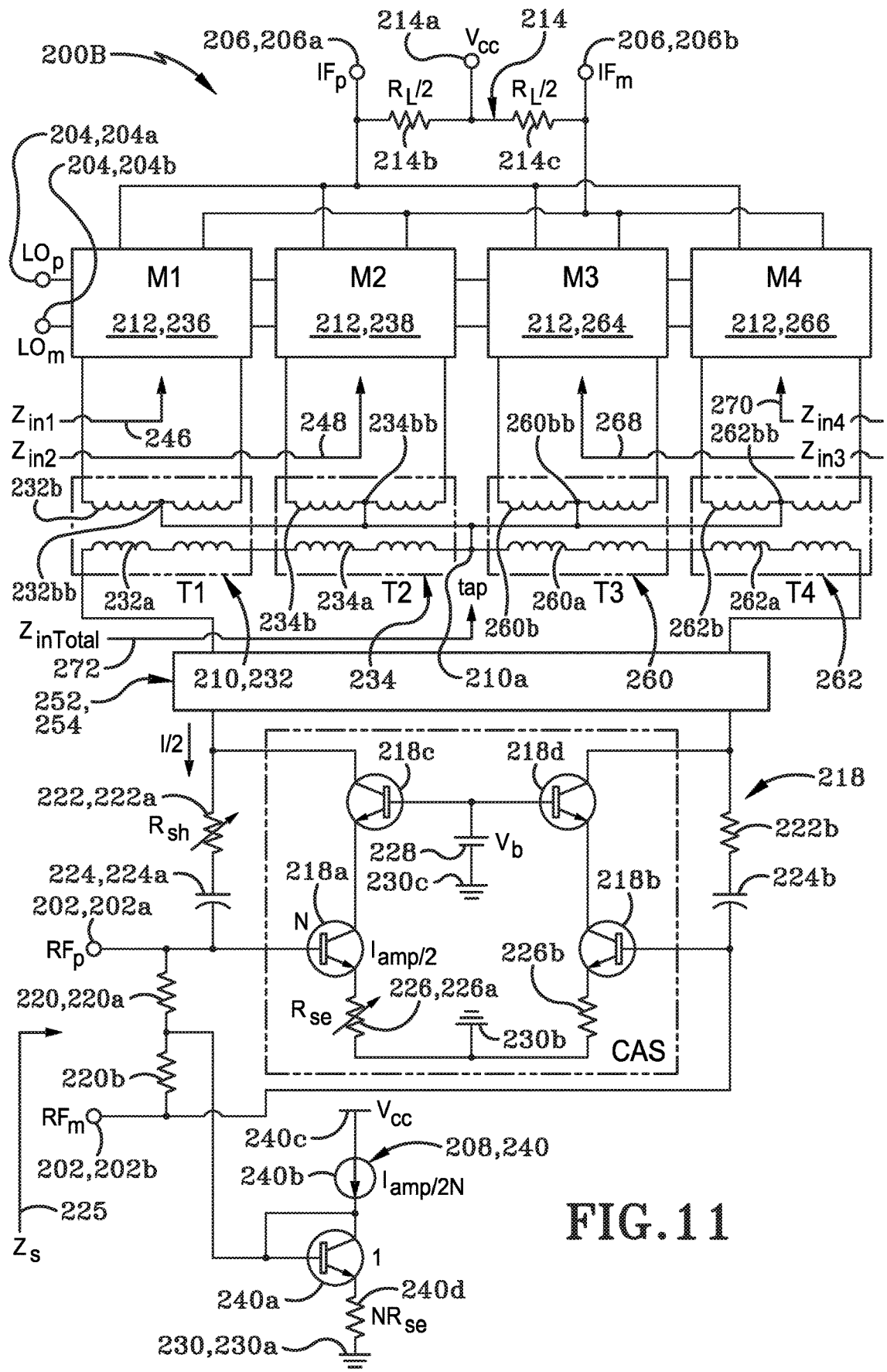
FIG. 11 is a schematic diagram of one embodiment of an active RF mixer apparatus in accordance with one aspect of the present disclosure.

FIG. 11 is a schematic view of one embodiment of an active RF mixer apparatus 200B in accordance with one aspect of the present disclosure. Active RF mixer apparatus 200B is substantially identical to active RF mixer apparatus 200A in structure and function with a few exceptions/additions that will be discussed hereafter in greater detail.

In this embodiment, the active RF mixer 200B may include a third transformer 260 and a fourth transformer 262. The third transformer 260 may include a primary 260a and a secondary 260b which includes a center tap 260bb. The fourth transformer 262 may include a primary 262a and a secondary 262b which includes a center tap 262bb.

In this embodiment, the active RF mixer 200B may include a third commutator cell 264 and a fourth commutator cell 266. The third commutator cell 264 may include a first transistor, a second transistor, a third transistor and a fourth transistor each of which are not shown but are substantially identical to the first transistor 236a, a second transistor 236b, a third transistor 236c and a fourth transistor 236d, respectively, of the first commutator cell 236 in structure and function. The fourth commutator cell 266 may include a first transistor, a second transistor, a third transistor and a fourth transistor each of which are not shown but are substantially identical to the first transistor 236a, a second transistor 236b, a third transistor 236c and a fourth transistor 236d, respectively, of the first commutator cell 236 in structure and function.

Instead of the primary 234a of the second transformer 234 being connected to the second node 258b of the second portion 258 of the notch filter 254, the primary 234a of the second transformer 234 is connected to the primary 260a of the third transformer 260 in series. The primary of the third transformer 260 is connected to the primary 262a of the fourth transformer 262 in series. The primary 262a of the fourth transformer 262 is connected to the second node 258b of the second portion 258 of the notch filter 254.

The secondary 260b of the third transformer 260 is connected to the emitters of the first transistor, the second transistor, the third transistor and the fourth transistor of the third commutator cell 264 and to the midpoint of the series connection of the primary 232a of the first transformer 232, the primary 234a of the second transformer 234, the primary 260a of the third transformer 260 and the primary 262a of the fourth transformer 262 via center tap 260bb.

The secondary 262b of the fourth transformer 262 is connected to the emitters of the first transistor, the second transistor, the third transistor and the fourth transistor of the fourth commutator cell 266 and to the midpoint of the series connection of the primary 232a of the first transformer 232, the primary 234a of the second transformer 234, the primary 260a of the third transformer 260 and the primary 262a of the fourth transformer 262 via center tap 262bb.

The connections of the transistors of the third commutator cell 264 and the connections of the transistors of the fourth commutator cell 266 are similar to the connections of the transistors 236a, 236b, 236c, and 236d of the first commutator cell and the transistors 238a, 238b, 238c and 238d of the second commutator cell 238, and, for brevity purposes, will not be described herein. As such the third commutator cell 264 and the fourth commutator cell 266 are connected to the first LO input terminal 204a in parallel, the second LO input terminal 204b in parallel, the first IF output terminal 206a in parallel and the second IF output terminal 206b in parallel. The active RF mixer apparatus 200B further shows a third commutator cell impedance 268, or $Z_{in3}$, looking into the third commutator cell 264 and seen by the amplifier mechanism 218 and a fourth commutator cell impedance 270, or $Z_{in4}$, looking into the fourth commutator cell 266 and seen by the amplifier mechanism 218 254. In this embodiment, the active RF mixer apparatus 200B further includes a total commutator cell impedance 272, or $Z_{inTotal}$ seen by the amplifier mechanism 218. $Z_{inTotal}$ is the sum of the first commutator cell impedance $Z_{in1}$, the second commutator cell impedance $Z_{in2}$, the third commutator cell impedance $Z_{in3}$ and the fourth commutator cell impedance $Z_{in4}$.

In operation, the active RF mixer apparatus 200B operates in a substantially identical manner to active RF mixer apparatus 200A, except that the impedance match value of the commutating elements (i.e. the first commutator cell 236, the second commutator cell 238, the third commutator cell 264 and the fourth commutator cell 266) and amplifier mechanism 218 of the active RF mixer apparatus 200B will be different compared to the active RF mixer apparatus 200A. In one example, division of the total DC by a factor of 4 and series impedance addition leads to an impedance increase that is sixteen times greater compared to the impedances of the PRIOR ART active RF mixers 10, 30 and 50.

Figure 12:
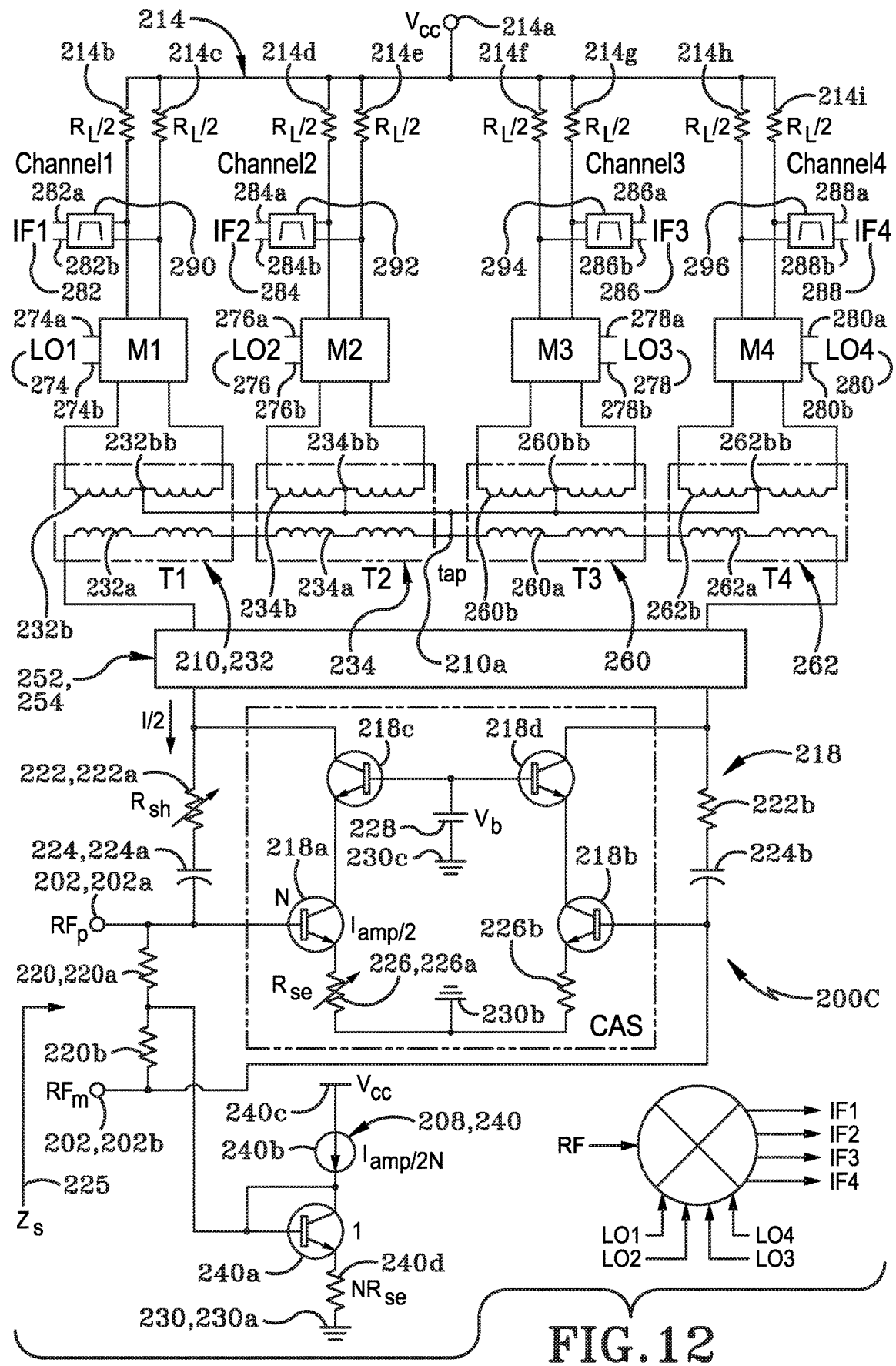
FIG. 12 is a schematic diagram of one embodiment of an active RF mixer apparatus in accordance with one aspect of the present disclosure.

FIG. 12 is a schematic view of one embodiment of an active RF mixer apparatus 200C in accordance with one aspect of the present disclosure. Active RF mixer apparatus 200C is substantially identical to active RF mixer apparatus 200B in structure and function with a few exceptions/additions that will be discussed hereafter in greater detail.

Instead of the first commutator cell 236, the second commutator cell 238, the third commutator cell 264 and the fourth commutator cell 266 being connected to the first LO input terminal 204a in parallel, the second LO input terminal 204b in parallel, the first IF output terminal 206a in parallel and the second IF output terminal 206b in parallel, each commutator cell 236, 238, 264 and 266 may be connected to separate differential LO terminals and separate differential IF terminals as discussed hereafter in greater detail.

In one particular embodiment, the active RF mixer apparatus 200C may include a first differential voltage LO input terminal 274 having a first LO input terminal 274a and a second LO input terminal 274b, a second differential voltage LO input terminal 276 having a first LO input terminal 276a and a second LO input terminal 276b, a third differential voltage LO input terminal 278 having a first LO input terminal 278a and a second LO input terminal 278b, and a fourth differential voltage LO input terminal 280 having a first LO input terminal 280a and a second LO input terminal 280b.

In one particular embodiment, the active RF mixer apparatus 200C may include a first differential voltage IF output terminal 282 having a first IF output terminal 282a and a second IF output terminal 282b, a second differential voltage IF output terminal 284 having a first IF output terminal 284a and a second IF output terminal 284b, a third differential voltage IF output terminal 286 having a first IF output terminal 286a and a second IF output terminal 286b, and a fourth differential voltage IF output terminal 288 having a first IF output terminal 288a and a second IF output terminal 288b.

In one particular embodiment, the load mechanism 214 of the active RF mixer apparatus 200C may include a voltage supply 214a, a first resistor 214b, a second resistor 214c, a third resistor 214d, a fourth resistor 214e, a fifth resistor 214f, a sixth resistor 214g, a seventh resistor 214h and an eighth resistor 214i.

In one particular embodiment, the active RF mixer apparatus 200C may include a first IF filter 290, a second IF filter 292, a third IF filter 294 and a fourth IF filter 296.

The first commutator cell 236 may be connected to the first LO input terminal 274a and the second LO input terminal 274b in a substantially identical manner to the connection of the first commutator cell 236 to the first LO input terminal 204a and the second LO input terminal 204b of active RF mixer apparatus 200. The first commutator cell 236 may be connected to the first IF output terminal 282a and the second IF output terminal 282b in a substantially identical manner to the connection of the first commutator cell 236 to the first IF output terminal 206a and the second IF output terminal 206b of active RF mixer apparatus 200 except that the first IF filter 290 is connected between the first commutator cell and the first IF output terminal 282a and the second IF output terminal 282b. The first resistor 214b is connected to the first IF filter 290 and the voltage supply 214a. The second resistor 214c is connected to the first IF filter 290 and the voltage supply 214a.

The second commutator cell 238 may be connected to the first LO input terminal 276a, the second LO input terminal 276b, the second IF filter 292, the first IF output terminal 284a and the second IF output terminal 284b in a substantially identical manner to the first commutator cell 236 of active RF mixer apparatus 200C. The third resistor 214d is connected to the second IF filter 292 and the voltage supply 214a. The fourth resistor 214e is connected to the second IF filter 292 and the voltage supply 214a.

The third commutator cell 266 may be connected to the first LO input terminal 278a, the second LO input terminal 278b, the third IF filter 294, the first IF output terminal 286a and the second IF output terminal 286b in a substantially identical manner to the first commutator cell 236 of active RF mixer apparatus 200C. The fifth resistor 214f is connected to the third IF filter 294 and the voltage supply 214a. The sixth resistor 214g is connected to the third IF filter 294 and the voltage supply 214a.

The fourth commutator cell 268 may be connected to the first LO input terminal 280a, the second LO input terminal 280b, the fourth IF filter 296, the first IF output terminal 288a and the second IF output terminal 288b in a substantially identical manner to the first commutator cell 236 of active RF mixer apparatus 200C. The seventh resistor 214h is connected to the fourth IF filter 296 and the voltage supply 214a. The eighth resistor 214i is connected to the fourth IF filter 296 and the voltage supply 214a.

In operation, the active RF mixer apparatus 200C operates in a substantially identical manner to active RF mixer apparatus 200B, except that the active RF mixer apparatus 200C operates as a multi-channel (frequency) device. More specifically, the first commutator cell 236, the second commutator cell 238, the third commutator cell 264 and the fourth commutator cell 266 are fed an amplified RF signal while being driven by separate LO terminals 274, 276, 278 and 280. The channels are separated at the IF output terminals 282, 284, 286 and 288 by the IF filters 290, 292, 294 and 296.

In accordance with one aspect of the present disclosure, exemplary circuit performance utilizing Jazz Semiconductor's 0.09 micron SiGe heterojunction bipolar transistor (HBT) is provided herein.

In one example, a single-cell (i.e. one commutator cell) broadband low power (i.e. 2V, 5 mA) active RF mixer exhibits a 5 dB conversion loss, a 9.0 dB noise figure with an input IIP3 of 3.2 dBm in the 20-50 GHz band. In order to improve the power handling of this RF mixer the DC may be increased through the mixer core as shown in FIG. 3. Increasing the mixer core current to 15 mA in a single cell mixer reduces the RF impedance to 12Ω which requires a 1:4 (i.e. 12Ω:48Ω) transformation network to achieve a match to 50Ω. With idealized lossless 1:4 impedance matching, a single-cell mixer circuit yields a 2.7 dB conversion loss, a 9.2 dB noise figure and a 7.0 dBm IIP3.

In one example, if the same RF mixer utilizes a double-cell (i.e. two commutator cells) configuration instead of the single-cell configuration, the RF impedance for the same 15 mA RF mixer increases in two ways. With the double-cell configuration, the 15 mA is split into two 7.5 mA per cell which increases the RF impedance on a per cell basis (i.e. 24Ω per cell), and the RF impedance is doubled (i.e. 48Ω) as a result of input voltage splitting. A dual-cell broadband mixer with a 1:1 transformer yields a 2.5 dB conversion loss, a 10 dB noise figure with an input IP3 of 12 dBm in the 20-50 GHz band. As such, the RF impedance matching is more suitable. When the transformation ratio is 1:1, suitable bandwidth and suitable loss is achieved. When comparing the driver requirements of this configuration to the driver requirements of the PRIOR ART RF mixers 10, 30 and 50, driver requirements for the RF mixer in this configuration are improved. Assuming the PRIOR ART RF mixers 10, 30 and 50 have a 15 mA mixer core current with a 12Ω load line, in order to swing 1.5 V (750 mV per mixer core), a 125 mA current is required. Assuming the RF mixer has a double-cell configuration as provided herein, to achieve the full 3 V swing (1.5 V per mixer core; two mixer cores), with a 50 ohm load line, 60 mA is required. With a 3 V driver supply, the amplifier dissipation is reduced from 375 milliwatts (mW) to 180 mW.

In one example, high IIP3 (i.e. approximately 20 dBm) is achievable at millimeter wave frequencies using 50 mA in a low voltage RF mixer (FIG. 3); however, the RF input impedance is low (i.e. 6Ω). In order to impedance match the 6Ω to a 50Ω source, a transformation ratio greater than 8 would be necessary. In one example, if a triple-cell RF mixer configuration is utilized, and the RF mixer utilizes 16 mA per cell, a 45Ω impedance may be achieved (i.e. 15Ω at 16 mA×3) which provides a more suitable transformer implementation. A conversion gain of 1.5 dB with a 10.5 dB noise figure and +19 dBm IIP3 is demonstrated.

Table 1 presents exemplary active RF mixer designs in the 20-50 GHz range and includes the type of configuration (Con.), the current (Ic) in mA, the conversion loss (C.L.) in dB, the input impedance ($R_{in}$) in Ω, the IIP3 in dBm, and the noise figure NF in dB. Table 1 is shown below:

TABLE 1

| Exemplary active RF mixer designs | | | | | |
|---|---|---|---|---|---|
| Con. | Ic | C.L. | Rin | IIP3 | NF |
| Single Cell | 5 | 5 | 36 | 3.2 | 9.0 |
| Single cell | 15 | 2.7 | 12 | 7.0 | 9.2 |
| Dual Cell | 2 × 7.5 | 2.5 | 2 × 24 | 12 | 10 |
| Triple cell | 3 × 16 | −1.5 (Gain) | 45 | 19 | 10.5 |
| Four Cell | 4 × 20 | 0.7 | 40 | 26 | 10.2 |

In accordance with one aspect of the present disclosure, it is envisioned that the low-power, high dynamic range active RF mixers 200, 200A, 299E and 200C of the present disclosure may be utilized for, inter alia, radar applications and 5th generation mobile networks or 5th generation wireless systems (5G) applications operating at extremely high frequency (EHF) (i.e. radio frequencies in the electromagnetic spectrum from 30 to 300 gigahertz (GHz)) which includes millimeter-wave frequencies. In one example, the active RF mixers 200, 200A, 299B and 200C of the present disclosure use multiple active cells to impedance match the mixing and amplification function within the conventional Gilbert cell mixer. By solving the impedance mismatch issue using current splitting between n active mixer cells and summing up the individual cell impedances, multiple impedance matched configurations may be available. As such, low voltage impedance matched active transformer coupled RF mixer topologies with high linearity are described herein. The present disclosure also addresses combining impedance matched amplifier and mixer configurations with current reuse, gain variation, image filtering, and multi-channel capabilities as described above.

It is further envisioned that the active RF mixers 200, 200A, 200B and 200C may be configured in any suitable manner, including, but not limited to, adding or removing transformers and commutator cells as necessary and depending on the desired design choice (e.g., a double-cell or triple-cell configuration).

It is further envisioned that the transformers of the active RF mixers 200, 200A, 200B and 200C may modify the total commutator cell impedance as desired.

Figure 13:
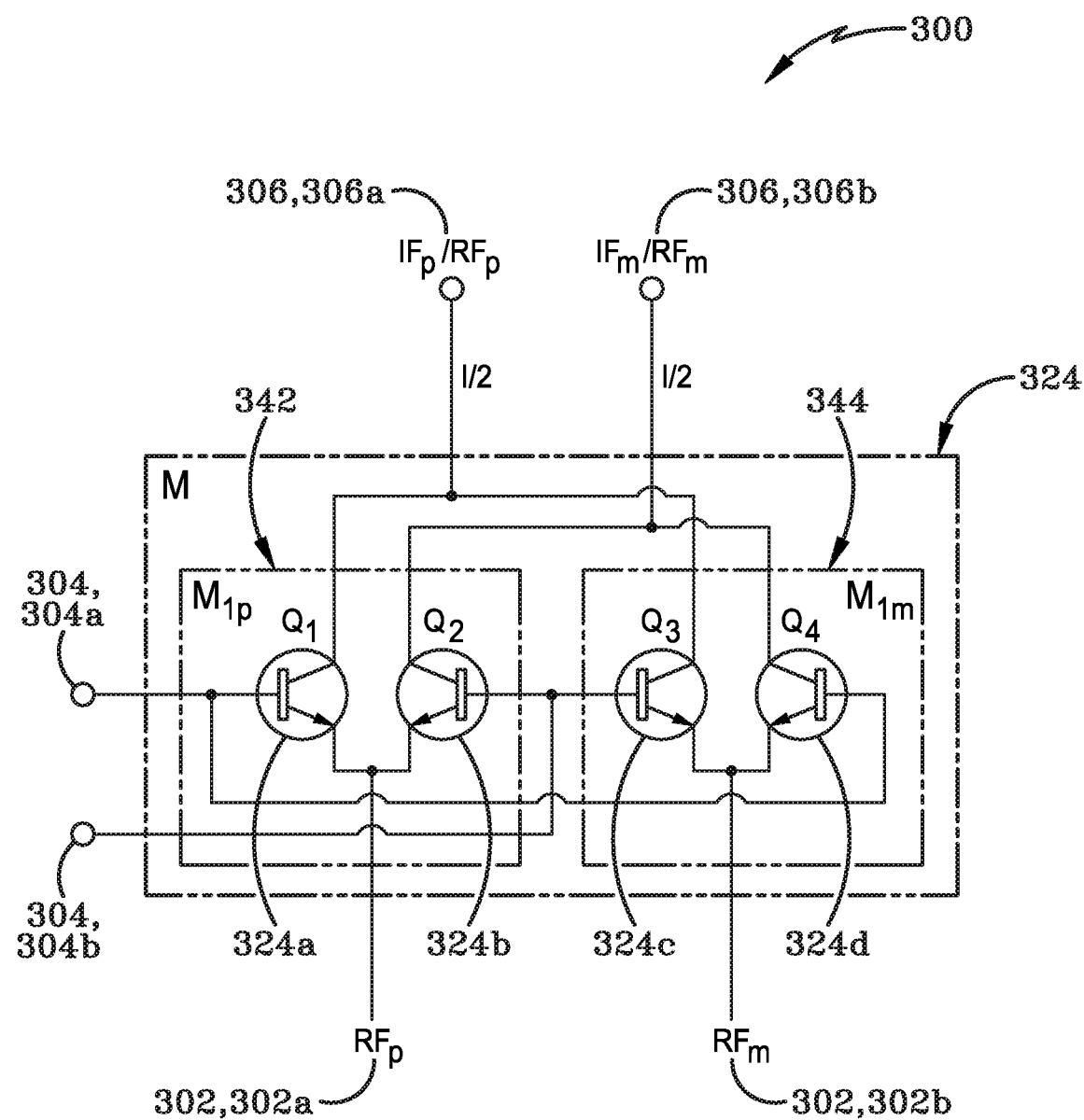
FIG. 13 is a schematic view of one embodiment of an active RF mixer apparatus in accordance with one aspect of the present disclosure.

FIG. 13 is a schematic view of one embodiment of an active RF mixer apparatus 300 in accordance with one aspect of the present disclosure. The active RF mixer apparatus 300 is substantially identical to the active RF mixer apparatus 100 of FIG. 5 in structure and function with a few exceptions/additions that will be discussed hereafter in greater detail. As described above, the RF mixer apparatus 100 includes, inter alia, a single-ended RF input terminal 102, a differential voltage LO input terminal 104 having a first LO input terminal 104a and a second LO input terminal 104b, a differential IF output terminal 106 having a first IF output terminal 106a and a second IF output terminal 106b, a first transformer 118, a second transformer 120, a third transformer 122, a first commutator cell 124, a second commutator cell 126, and a third commutator cell 128. As described above, the secondary 118b of the first transformer 118 is connected to the emitters of the first transistor 124a, the second transistor 124b, the third transistor 124c, and the fourth transistor 124d of the first commutator cell 124 and the first current source 130 via center tap 118bb.

In one particular embodiment, instead of including three commutator cells, the active RF mixer apparatus 300 includes a single commutator cell 324 which is substantially identical to the first commutator cell 124 of FIG. 5 except that the commutator cell 324 is operatively connected to an open ended differential voltage RF input terminal 302 having a first RF input terminal 302a, which may also be referred to as the $RF_p$ input terminal, and a second RF input terminal 302b, which may also be referred to as the $RF_m$ input terminal. Similar to the active RF mixer apparatus 100, the active RF mixer apparatus 300 includes a differential voltage LO input terminal 304 having a first LO input terminal 304a and a second LO input terminal 304b, and a differential IF output terminal 306 having a first IF output terminal 306a and a second IF output terminal 306b.

As such, the commutator cell 324, according to this exemplary embodiment, includes a first transistor 324a, a second transistor 324b, a third transistor 324c, and a fourth transistor 324d. In one example, the commutator cell 324 may be a bipolar junction transistor mixer; however, the commutator cell 324 may be any suitable mixing mechanism. The commutator cell 324 may utilize any suitable transistors including, but not limited to, bipolar transistors, n-type field effect transistors (nFETs), pseudomorphic high-electron mobility transistors (pHEMTs), metal-semiconductor field-effect transistors (MESFETs) and gallium nitride (GaN) transistors. In one embodiment, the first transistor 324a and the second transistor 324b are a cross-coupled pair of transistors. The emitter of the first transistor 324a is connected to the emitter of the second transistor 324b. The third transistor 324c and the fourth transistor 324d are a cross-coupled pair of transistors. The emitter of the first transistor 324a is connected to the emitter of the second transistor 324b.

In one embodiment, the active RF mixer apparatus 300 includes a first commutator sub-cell 342 and a second commutator sub-cell 344. The first commutator sub-cell 342, which may also be referred to as $M_{1p}$, includes the first transistor 324a and the second transistor 324b. The second commutator sub-cell 344, which may also be referred to as $M_{1m}$, includes the third transistor 324c and the fourth transistor 324d. In this embodiment, the first commutator sub-cell 342 is operatively connected to the first RF input terminal 302a and the second commutator sub-cell 344 is operatively connected to the second RF input terminal 302b.

In one embodiment, the first commutator sub-cell 342 and the second commutator sub-cell 344 are operatively connected with other commutator sub-cells to form a reconfigurable active RF mixer apparatus as further described below.

Figure 14:
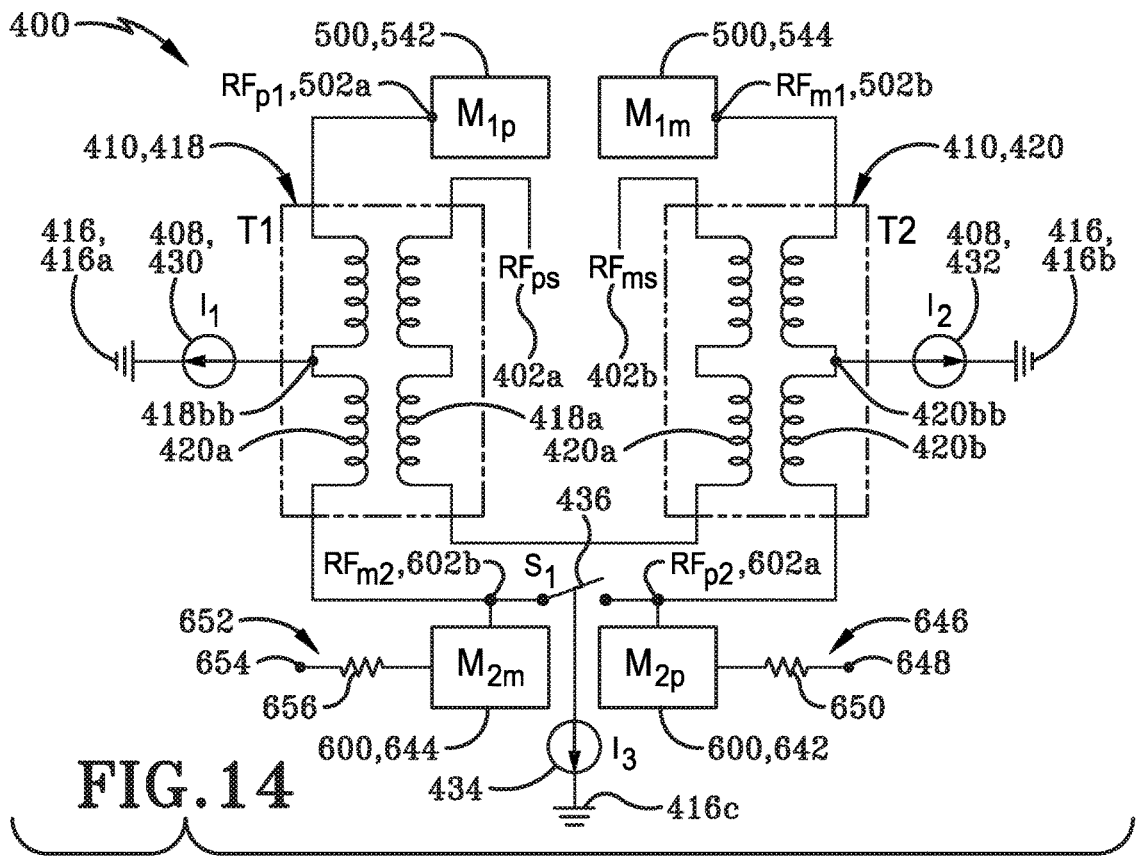
FIG. 14 is a schematic view of one embodiment of a reconfigurable double-cell active RF mixer apparatus in accordance with one aspect of the present disclosure.

FIG. 14 is a schematic view of one embodiment of a reconfigurable double-cell (i.e. two commutator cells) active RF mixer apparatus 400 in accordance with one aspect of the present disclosure. The reconfigurable double-cell active RF mixer apparatus 400 includes a first active RF mixer apparatus 500 and a second active RF mixer apparatus 600. In one embodiment, the first active RF mixer apparatus 500 and the second active RF mixer apparatus 600 are substantially identical to the active RF mixer apparatus 300 of FIG. 13; however, some components are removed for clarity in FIG. 14. For example, the components of the first active RF mixer apparatus 500 and the second active RF mixer apparatus 600 corresponding to the components of the active RF mixer apparatus 300, such as the differential voltage LO input terminal 304 having the first LO input terminal 304a and the second LO input terminal 304b and the differential IF output terminal 306 having the first IF output terminal 306a and the second IF output terminal 306b are not shown in FIG. 14, however, it is to be understood that the first active RF mixer apparatus 500 and the second active RF mixer apparatus 600 include all necessary components even if they are not described in detail herein.

In one particular embodiment, the active RF mixer apparatus 500 includes a first commutator sub-cell 542 and a second commutator sub-cell 544. The first commutator sub-cell 542 is substantially identical to the first commutator sub-cell 342 of FIG. 13 and the second commutator sub-cell 544 is substantially identical to the second commutator sub-cell 344 of FIG. 13. The first commutator sub-cell 542 includes a first RF input terminal 502a, which may also be referred to as the $RF_{p1}$ input terminal, and the second commutator sub-cell 544 includes a second RF input terminal 502b, which may also be referred to as the $RF_{m1}$ input terminal. In one particular embodiment, the active RF mixer apparatus 600 includes a first commutator sub-cell 642 and a second commutator sub-cell 644. The first commutator sub-cell 642 is substantially identical to the first commutator sub-cell 342 of FIG. 13 and the second commutator sub-cell 644 is substantially identical to the second commutator sub-cell 344 of FIG. 13. The first commutator sub-cell 642 includes a first RF input terminal 602a, which may also be referred to as the $RF_{p2}$ input terminal, and the second commutator sub-cell 644 includes a second RF input terminal 602b, which may also be referred to as the $RF_{m2}$ input terminal.

The second active RF mixer apparatus 600 includes a first control mechanism 646 to activate or deactivate the first commutator sub-cell 642. In one example, the control mechanism 646 is a base voltage 648 and a resistor 650. The second active RF mixer apparatus 600 includes a second control mechanism 652 to activate or deactivate the second commutator sub-cell 644. In one example, the second control mechanism 652 is a base voltage 654 and a resistor 656.

The reconfigurable double-cell active RF mixer apparatus 400 further includes at least one current source 408, at least one transformer 410, at least one ground 416, a differential voltage RF input terminal 402 having a first RF input terminal 402a, which may also be referred to as the $RF_{ps}$ input terminal, and a second RF input terminal 402b, which may also be referred to as the $RF_{ms}$ input terminal, and a switching device 436, which may also be referred to as $S_1$. In one example, the switching device 436 may be a field effect transistor (FET) of any suitable size or a microelectromechanical (MEMS) switch of any suitable size; however any suitable switching device 436 may be utilized.

In one particular embodiment, the reconfigurable double-cell active RF mixer apparatus 400 includes a first ground 416a, a second ground 416b, and a third ground 416c.

In one particular embodiment, the reconfigurable double-cell active RF mixer apparatus 400 includes a first transformer 418 and a second transformer 420. The first transformer 418 includes a primary 418a and a secondary 418b which includes a center tap 418bb. The second transformer 420 includes a primary 420a and a secondary 420b which includes a center tap 420bb. In one example, the first transformer 418 and the second transformer 420 are 1:1 planar transformers; however, any suitable transformers may be utilized, such as planar spiral transformers, wire-wound transformers, slab transformers, and the like. It should be noted that the selection of the type of transformers may be dependent, at least in part, on the desired operational frequencies of the reconfigurable active RF mixer apparatuses of the present disclosure.

In one particular embodiment, the reconfigurable double-cell active RF mixer apparatus 400 includes a first current source 430, a second current source 432 and a third current source 434.

In one particular embodiment, the primary 418a of the first transformer 418 is connected to the first RF input terminal 402a, or the $RF_{ps}$ input terminal, and the primary 420a of the second transformer 420 in series. The primary 420a of the second transformer 420 is connected to the second RF input terminal 402b, or the $RF_{ms}$ input terminal.

In one particular embodiment, the secondary 418b of the first transformer 418 is connected to the first RF input terminal 502a, or the $RF_{p1}$ input terminal, the first current source 430, the second RF input terminal 602b, or the $RF_{m2}$ input terminal, and the switching device 436. The secondary 420b of the second transformer 420 is connected to the second RF input terminal 502b, or the $RF_{m1}$ input terminal, the second current source 432, the first RF input terminal 602a, or the $RF_{p2}$ input terminal, and the switching device 436. The switching device 436 is connected to the third current source 434.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In operation, the reconfigurable double-cell active RF mixer apparatus 400 operates as a double-cell active RF mixer apparatus or a single-cell active RF mixer apparatus depending on its configuration and as described below.

The reconfigurable double-cell active RF mixer apparatus 400 operates as a double-cell active RF mixer apparatus when the first current source 430 and the second current source 432 are active, the switching device 436 is "off," the third current source 434 is inactive, the first commutator sub-cell 542 of the first RF active mixer apparatus 500 is active, the second sub-cell 544 of the first active RF mixer apparatus 500 is active, the first commutator sub-cell 642 of the second RF active mixer apparatus 600 is active, and the second sub-cell 644 of the second active RF mixer apparatus 600 is active. When the reconfigurable double-cell active RF mixer apparatus 400 is in this configuration, the reconfigurable double-cell active RF mixer apparatus 400 operates as a double-cell mixer in accordance with the teachings of the present disclosure. Specifically, the first commutator sub-cell 542 of the first active RF mixer apparatus 500 and the second commutator sub-cell 644 of the second active RF mixer apparatus 600 are operatively connected to form a first commutator cell and the second commutator sub-cell 544 of the first active RF mixer apparatus 500 and the first commutator sub-cell 642 of the second active RF mixer apparatus 600 are operatively connected to form a second commutator cell.

In operation, an RF input signal (not shown) is split by the first transformer 418 and the second transformer 420 and fed to the first commutator cell formed by the first commutator sub-cell 542 and the second commutator sub-cell 644 and the second commutator cell formed by the second commutator sub-cell 544 and the first commutator sub-cell 642. The first commutator cell and the second commutator cell are driven by the LO input terminal. The first commutator cell has a bias current from the first current source 430, or $I_1$, and the second commutator cell has a bias current from the second current source 432, or $I_2$. In one example, $I_1$ and $I_2$ are equal and are each one half of the total commutator cell DC. The RF input signal is down-converted to a desired IF signal. The outputs of the first commutator cell and the second commutator cell are connected in parallel combining the currents of the first commutator cell and the second commutator cell.

In one example, the architecture of the reconfigurable double-cell active RF mixer apparatus 400 simultaneously provides improved power handling and improved impedance matching compared to conventional active RF mixers including the PRIOR ART mixers 10, 30 and 50. In one example, the architecture allows the reconfigurable double-cell active RF mixer apparatus 400 to operate with larger DC while increasing the input intercept point (IIP3) and the 1 dB compression point (P1db).

More specifically, and in one example, the improved power handling and improved impedance matching is accomplished by splitting the total DC (I) equally (I/2) between the first commutator cell and the second commutator cell. An RF source impedance (not shown) is presented to the RF input terminal 402a and 402b. The total commutator cell impedance, which is the sum of the first commutator cell impedance (not shown) and the second commutator cell impedance (not shown) is matched to the RF source impedance (not shown). In one example, the individual commutator cell impedance $$\left( \propto \frac{2}{I} \right)$$

is two times greater than the total commutator cell impedance of the PRIOR ART active RF mixers 10, 30 and 50. The RF impedances of each commutator cell are additively summed at the RF input terminal 402a and 402b by 1:1 transformers 418 and 420 whose primaries 418a and 420a are connected in series which provides a total RF impedance that is four times greater than the RF impedances presented by the PRIOR ART active RF mixers 10, 30 and 50. The impedance transformation is accomplished, at least in part, by current splitting between two commutator cells and using 1:1 transformers. A 1:1 transformer has a stronger magnetic coupling factor k with equal primary and secondary turns compared to other transformers, such as a 1:4 transformer. This minimizes leakage flux present in 1:1 transformers and also yields low-loss with improved passive transformation efficiency and broadband matching. Further, the linearity of the reconfigurable double-cell active RF mixer apparatus 400 is improved by operating in a higher DC range compared to conventional active RF mixers.

In one particular embodiment, the reconfigurable double-cell active RF mixer apparatus 400 operates as a single-cell active RF mixer apparatus when the first current source 430 and the second current source 432 are inactive, the switching device 436 is "on," the third current source 434 is active, the first commutator sub-cell 542 of the first RF active mixer apparatus 500 is active, the second sub-cell 544 of the first active RF mixer apparatus 500 is active, the first commutator sub-cell 642 of the second RF active mixer apparatus 600 is inactive, and the second sub-cell 644 of the second active RF mixer apparatus 600 is inactive. When the reconfigurable double-cell active RF mixer apparatus 400 is in this configuration, the reconfigurable double-cell active RF mixer apparatus 400 operates as a single-cell mixer in accordance with the teachings of the present disclosure. Specifically, the first commutator sub-cell 542 of the first active RF mixer apparatus 500 and the second commutator sub-cell 544 of the first active RF mixer apparatus 500 are operatively connected to form a commutator cell.

Figure 15:
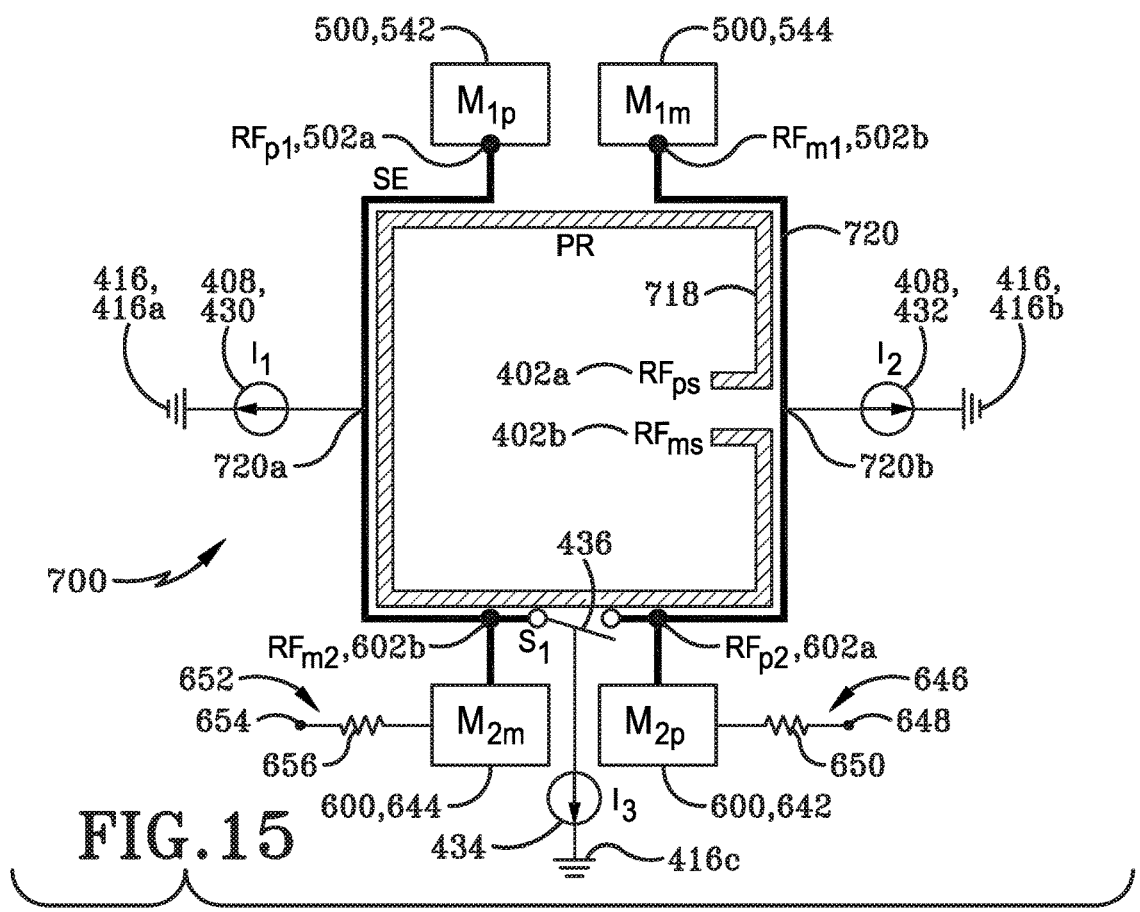
FIG. 15 is a schematic view of one embodiment of a reconfigurable double-cell active RF mixer apparatus in accordance with one aspect of the present disclosure.

FIG. 15 is a schematic view of one embodiment of a reconfigurable double-cell (i.e. two commutator cells) active RF mixer apparatus 700 in accordance with one aspect of the present disclosure. The reconfigurable double-cell active RF mixer apparatus 700 is substantially identical to the reconfigurable double-cell active RF mixer apparatus 400 of FIG. 14 in structure and function with a few exceptions/additions that will be discussed hereafter in greater detail. Instead of utilizing transformers having a primary coil and a secondary coil, the reconfigurable double-cell active RF mixer apparatus 700 includes a primary slab transformer 718 and a secondary slab transformer 720. In one particular embodiment, the secondary slab transformer 720 includes a first center tap 720a and a second center tap 720b. The primary slab transformer 718 and the secondary slab transformer 720 may be configured in any suitable manner.

In one particular embodiment, the primary slab transformer 718 is connected to the first RF input terminal 402a, or the $RF_{ps}$ input terminal, and the second RF input terminal 402b, or the $RF_{ms}$ input terminal. The secondary slab transformer 720 is connected to the first RF input terminal 502a, or the $RF_{p1}$ input terminal, the first current source 430 via center tap 720a, the second RF input terminal 602b, or the $RF_{m2}$ input terminal, the switching device 436, the second RF input terminal 502b, or the $RF_{m1}$ input terminal, the second current source 432 via center tap 720b, and the first RF input terminal 602a. The switching device 436 is connected to the third current source 434.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In operation, the reconfigurable double-cell active RF mixer apparatus 700 operates as a double-cell active RF mixer apparatus or a single-cell active RF mixer apparatus depending on its configuration in a substantially identical manner to the reconfigurable double-cell active RF mixer apparatus 400 of FIG. 14 and thus will not be further described herein.

Figure 16:
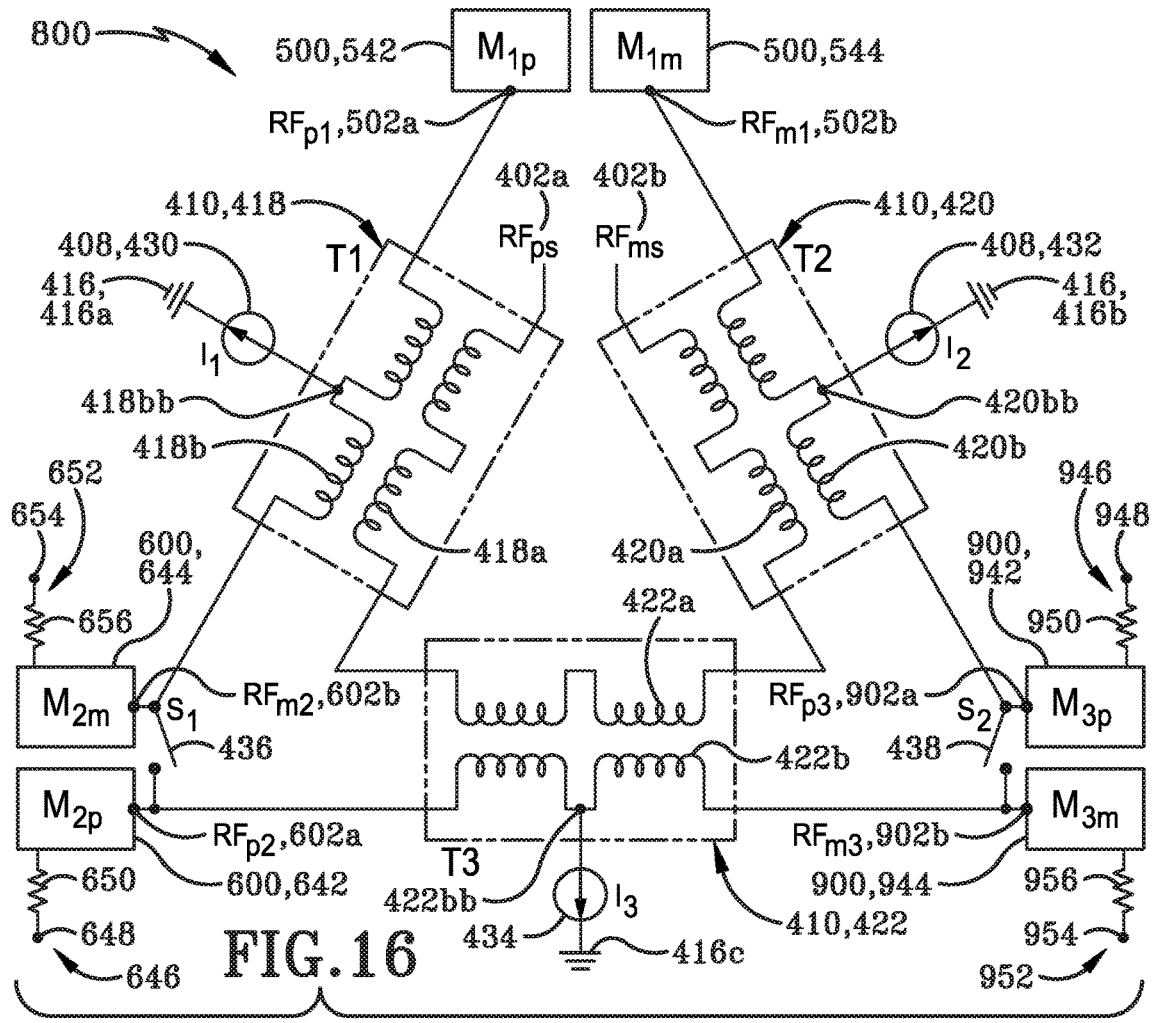
FIG. 16 is a schematic view of one embodiment of a reconfigurable triple-cell active RF mixer apparatus in accordance with one aspect of the present disclosure.

FIG. 16 is a schematic view of one embodiment of a reconfigurable triple-cell (i.e. three commutator cells) active RF mixer apparatus 800 in accordance with one aspect of the present disclosure. The reconfigurable triple-cell active RF mixer apparatus 800 is substantially identical to the reconfigurable double-cell active RF mixer apparatus 400 of FIG. 14 in structure and function with a few exceptions/additions that will be discussed hereafter in greater detail. The reconfigurable triple-cell active RF mixer apparatus 800 includes a third active RF mixer apparatus 900, a third transformer 422, and a second switching device 438. In one embodiment, the third active RF mixer apparatus 900 is substantially identical to the first active RF mixer apparatus 500 and the second active RF mixer apparatus 600. Although not all components of the first active RF mixer apparatus 500, the second active RF mixer apparatus 600, and the third active RF mixer apparatus 900 are shown in FIG. 16, it is to be understood that the first active RF mixer apparatus 500, the second active RF mixer apparatus 600, and the third active RF mixer apparatus 900 include all necessary components even if they are not described in detail herein.

In one particular embodiment, the active RF mixer apparatus 500 includes a first commutator sub-cell 542 and a second commutator sub-cell 544. The first commutator sub-cell 542 is substantially identical to the first commutator sub-cell 342 of FIG. 13 and the second commutator sub-cell 544 is substantially identical to the second commutator sub-cell 344 of FIG. 13. The first commutator sub-cell 542 includes a first RF input terminal 502a, which may also be referred to as the $RF_{p1}$ input terminal, and the second commutator sub-cell 544 includes a second RF input terminal 502b, which may also be referred to as the $RF_{m1}$ input terminal. In one particular embodiment, the active RF mixer apparatus 600 includes a first commutator sub-cell 642 and a second commutator sub-cell 644. The first commutator sub-cell 642 is substantially identical to the first commutator sub-cell 342 of FIG. 13 and the second commutator sub-cell 644 is substantially identical to the second commutator sub-cell 344 of FIG. 13. The first commutator sub-cell 642 includes a first RF input terminal 602a, which may also be referred to as the $RF_{p2}$ input terminal, and the second commutator sub-cell 644 includes a second RF input terminal 602b, which may also be referred to as the $RF_{m2}$ input terminal. In one particular embodiment, the active RF mixer apparatus 900 includes a first commutator sub-cell 942 and a second commutator sub-cell 944. The first commutator sub-cell 942 is substantially identical to the first commutator sub-cell 342 of FIG. 13 and the second commutator sub-cell 944 is substantially identical to the second commutator sub-cell 344 of FIG. 13. The first commutator sub-cell 942 includes a first RF input terminal 902a, which may also be referred to as the $RF_{p3}$ input terminal, and the second commutator sub-cell 944 includes a second RF input terminal 902b, which may also be referred to as the $RF_{m3}$ input terminal.

The second active RF mixer apparatus 600 includes a first control mechanism 646 to activate or deactivate the first commutator sub-cell 642. In one example, the control mechanism 646 is a base voltage 648 and a resistor 650. The second active RF mixer apparatus 600 includes a second control mechanism 652 to activate or deactivate the second commutator sub-cell 644. In one example, the second control mechanism 652 is a base voltage 654 and a resistor 656.

The third active RF mixer apparatus 900 includes a first control mechanism 946 to activate or deactivate the first commutator sub-cell 942. In one example, the control mechanism 946 is a base voltage 948 and a resistor 950. The third active RF mixer apparatus 900 includes a second control mechanism 952 to activate or deactivate the second commutator sub-cell 944. In one example, the second control mechanism 952 is a base voltage 954 and a resistor 956.

In one particular embodiment, the third transformer 422 includes a primary 422a and a secondary 422b which includes a center tap 422bb. In one example, the third transformer 422 is a 1:1 planar transformer; however, any suitable transformers may be utilized.

In one particular embodiment, the primary 418a of the first transformer 418 is connected to the first RF input terminal 402a, or the $RF_{ps}$ input terminal, the primary 422a of the third transformer 422, and the primary 420a of the second transformer 420 in series. The primary 420a of the second transformer 420 is connected to the second RF input terminal 402b, or the $RF_{ms}$ input terminal.

In one particular embodiment, the secondary 418b of the first transformer 418 is connected to the first RF input terminal 502a, or the $RF_{p1}$ input terminal, the first current source 430, the second RF input terminal 602b, or the $RF_{m2}$ input terminal, and the first switching device 436. The secondary 420b of the second transformer 420 is connected to the second RF input terminal 502b, or the $RF_{m1}$ input terminal, the second current source 432, the first RF input terminal 602a, or the $RF_{p2}$ input terminal, and the second switching device 438.

In one particular embodiment, the secondary 422b of the third transformer 422 is connected to the first RF input terminal 602a, or the $RF_{p2}$ input terminal, the first switching device 436, the third current source 434, the second switching device 438, and the second RF input terminal 902b, or the $RF_{m3}$ input terminal.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In one particular embodiment, the base voltage 948 of the first control mechanism 946 is connected to the resistor 950 of the first control mechanism 946 and the resistor 950 is connected to the first commutator sub-cell 942 in any suitable manner. In one particular embodiment, the base voltage 954 of the second control mechanism 952 is connected to the resistor 956 of the second control mechanism 952 and the resistor 956 is connected to the second commutator sub-cell 944 in any suitable manner.

In operation, the reconfigurable triple-cell active RF mixer apparatus 800 operates as a triple-cell active RF mixer apparatus or a single-cell active RF mixer apparatus depending on its configuration and as described below.

The reconfigurable triple-cell active RF mixer apparatus 800 operates as a triple-cell active RF mixer apparatus when the first current source 430, the second current source 432, and the third current source 434 are active, the first switching device 436 is "off," the second switching device 438 is "off," the first commutator sub-cell 542 of the first RF active mixer apparatus 500 is active, the second sub-cell 544 of the first active RF mixer apparatus 500 is active, the first commutator sub-cell 642 of the second RF active mixer apparatus 600 is active, the second sub-cell 644 of the second active RF mixer apparatus 600 is active, the first commutator sub-cell 942 of the third RF active mixer apparatus 900 is active, and the second sub-cell 944 of the third active RF mixer apparatus 900 is active. When the reconfigurable triple-cell active RF mixer apparatus 800 is in this configuration, the reconfigurable triple-cell active RF mixer apparatus 800 operates as a triple-cell mixer in accordance with the teachings of the present disclosure. Specifically, the first commutator sub-cell 542 of the first active RF mixer apparatus 500 and the second commutator sub-cell 644 of the second active RF mixer apparatus 600 are operatively connected to form a first commutator cell, the first commutator sub-cell 642 of the second active RF mixer apparatus 600 and the second commutator sub-cell 944 of the third active RF mixer apparatus 900 are operatively connected to form a second commutator cell, and the first commutator sub-cell 942 of the third active RF mixer apparatus 900 and the second commutator sub-cell 544 of the first active RF mixer apparatus 500 are operatively connected to form a third commutator cell.

In operation, an RF input signal (not shown) is split by the first transformer 418, the second transformer 420, and the third transformer 422 and fed to the first commutator cell formed by the first commutator sub-cell 542 and the second commutator sub-cell 644, the second commutator cell formed by the first commutator sub-cell 642 and the second commutator sub-cell 944, and the third commutator cell formed by the first commutator sub-cell 942 and the second commutator sub-cell 544. The first commutator cell, the second commutator cell, and the third commutator cell are driven by the LO input terminal. The first commutator cell has a bias current from the first current source 430, or $I_1$, the second commutator cell has a bias current from the third current source 434, or $I_3$, and the third commutator cell has a bias current from the second current source 432, or $I_2$. In one example, $I_1$, $I_2$, and $I_3$ are equal and are each one third of the total commutator cell DC. The RF input signal is down-converted to a desired IF signal. The outputs of the first commutator cell, the second commutator cell, and the third commutator cell are connected in parallel combining the currents of the first commutator cell, the second commutator cell, and the third commutator cell.

In one example, the architecture of the reconfigurable triple-cell active RF mixer apparatus 800 simultaneously provides improved power handling and improved impedance matching compared to conventional active RF mixers including the PRIOR ART mixers 10, 30 and 50. In one example, the architecture allows the reconfigurable triple-cell active RF mixer apparatus 800 to operate with larger DC while increasing the input intercept point (IIP3) and the 1 dB compression point (P1db).

More specifically, and in one example, the improved power handling and improved impedance matching is accomplished by splitting the total DC (I) equally (I/3) between the first commutator cell, the second commutator cell, and the third commutator cell. An RF source impedance (not shown) is presented to the RF input terminal 402a and 402b. The total commutator cell impedance, which is the sum of the first commutator cell impedance (not shown), the second commutator cell impedance (not shown), and the third commutator cell impedance (not shown) is matched to the RF source impedance (not shown). In one example, the individual commutator cell impedance $$\left(\propto \frac{3}{1}\right)$$

is three times greater than the total commutator cell impedance of the PRIOR ART active RF mixers 10, 30 and 50. The RF impedances of each commutator cell are additively summed at the RF input terminal 402a and 402b by 1:1 transformers 418, 420, and 422 whose primaries 418a, 420a, and 422a are connected in series which provides a total RF impedance that is nine times greater than the RF impedances presented by the PRIOR ART active RF mixers 10, 30 and 50. The impedance transformation is accomplished, at least in part, by current splitting between three commutator cells and using 1:1 transformers. A 1:1 transformer has a stronger magnetic coupling factor k with equal primary and secondary turns compared to other transformers, such as a 1:4 transformer. This minimizes leakage flux present in 1:1 transformers and also yields low-loss with improved passive transformation efficiency and broadband matching. Further, the linearity of the reconfigurable triple-cell active RF mixer apparatus 800 is improved by operating in a higher DC range compared to conventional active RF mixers.

In one particular embodiment, the reconfigurable triple-cell active RF mixer apparatus 800 operates as a single-cell active RF mixer apparatus when the first current source 430 and the second current source 432 are inactive, the first switching device 436 is "on," the second switching device 438 is "on," the third current source 434 is active, the first commutator sub-cell 642 of the second RF active mixer apparatus 600 is inactive, the second sub-cell 644 of the second active RF mixer apparatus 600 is inactive, the first commutator sub-cell 942 of the third RF active mixer apparatus 900 is inactive, and the second sub-cell 944 of the second active RF mixer apparatus 900 is inactive. When the reconfigurable double-cell active RF mixer apparatus 800 is in this configuration, the reconfigurable double-cell active RF mixer apparatus 800 operates as a single-cell mixer in accordance with the teachings of the present disclosure. Specifically, the first commutator sub-cell 542 of the first active RF mixer apparatus 500 and the second commutator sub-cell 544 of the first active RF mixer apparatus 500 are operatively connected to form a commutator cell.

Figure 17:
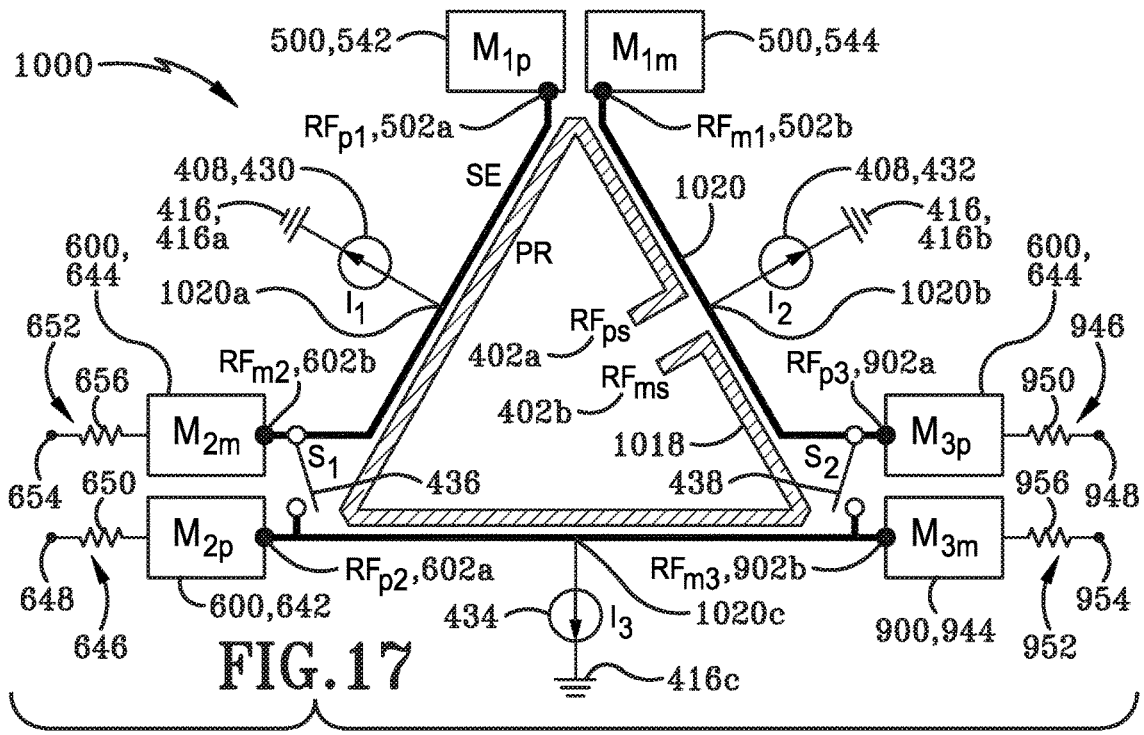
FIG. 17 is a schematic view of one embodiment of a reconfigurable triple-cell active RF mixer apparatus in accordance with one aspect of the present disclosure.

FIG. 17 is a schematic view of one embodiment of a reconfigurable triple-cell (i.e. three commutator cells) active RF mixer apparatus 1000 in accordance with one aspect of the present disclosure. The reconfigurable triple-cell active RF mixer apparatus 1000 is substantially identical to the reconfigurable triple-cell active RF mixer apparatus 800 of FIG. 16 in structure and function with a few exceptions/additions that will be discussed hereafter in greater detail. Instead of utilizing transformers having a primary coil and a secondary coil, the reconfigurable triple-cell active RF mixer apparatus 1000 includes a primary slab transformer 1018 and a secondary slab transformer 1020. In one particular embodiment, the secondary slab transformer 1020 includes a first center tap 1020a, a second center tap 1020b, and a third center tap 1020c. The primary slab transformer 1018 and the secondary slab transformer 1020 may be configured in any suitable manner.

In one particular embodiment, the primary slab transformer 1018 is connected to the first RF input terminal 402a, or the $RF_{ps}$ input terminal, and the second RF input terminal 402b, or the $RF_{ms}$ input terminal. The secondary slab transformer 1020 is connected to the first RF input terminal 502a, or the $RF_{p1}$ input terminal, the first current source 430 via center tap 1020a, the second RF input terminal 602b, or the $RF_{m2}$ input terminal, the first switching device 436, the first RF input terminal 602a, or the $RF_{p2}$ input terminal, the third current source 434 via center tap 1020c, the second switching device 438, the second RF input terminal 902b, or the $RF_{m3}$ input terminal, the first RF input terminal 902a, or the $RF_{p3}$ input terminal, the second current source 432 via center tap 1020b, and the second RF input terminal 502b, or the $RF_{m1}$ input terminal.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In one particular embodiment, the base voltage 948 of the first control mechanism 946 is connected to the resistor 950 of the first control mechanism 946 and the resistor 950 is connected to the first commutator sub-cell 942 in any suitable manner. In one particular embodiment, the base voltage 954 of the second control mechanism 952 is connected to the resistor 956 of the second control mechanism 952 and the resistor 956 is connected to the second commutator sub-cell 944 in any suitable manner.

In operation, the reconfigurable triple-cell active RF mixer apparatus 1000 operates as a triple-cell active RF mixer apparatus or a single-cell active RF mixer apparatus depending on its configuration in a substantially identical manner to the reconfigurable triple-cell active RF mixer apparatus 800 of FIG. 16 and thus will not be further described herein.

Figure 18:
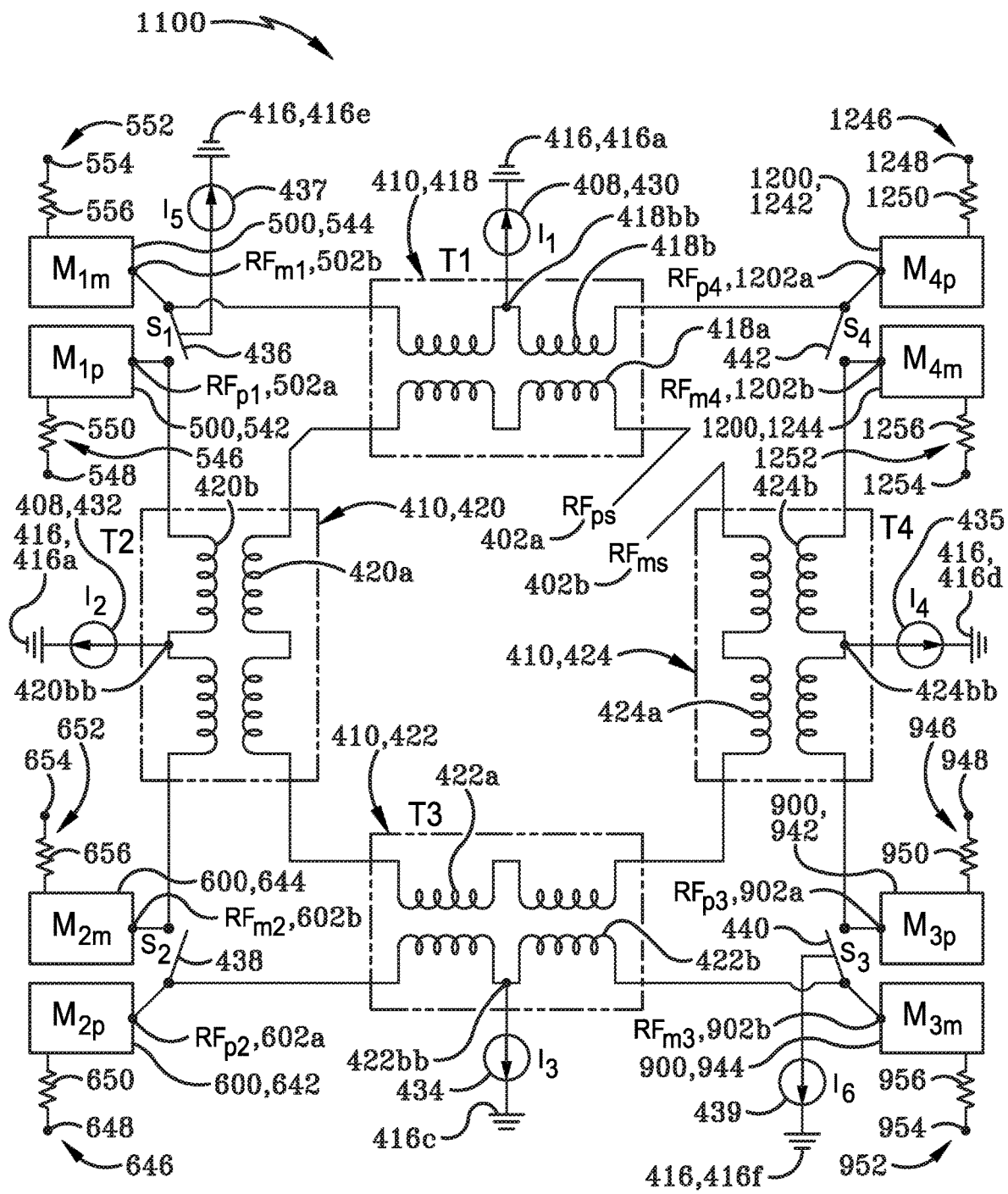
FIG. 18 is a schematic view of one embodiment of a reconfigurable quadruple-cell active RF mixer apparatus in accordance with one aspect of the present disclosure.

FIG. 18 is a schematic view of one embodiment of a reconfigurable quadruple-cell (i.e. four commutator cells) active RF mixer apparatus 1100 in accordance with one aspect of the present disclosure. The reconfigurable quadruple-cell active RF mixer apparatus 1100 is substantially identical to the reconfigurable triple-cell active RF mixer apparatus 800 of FIG. 16 in structure and function with a few exceptions/additions that will be discussed hereafter in greater detail. The reconfigurable quadruple-cell active RF mixer apparatus 1100 includes a fourth active RF mixer apparatus 1200, a fourth transformer 424, a fourth ground 416d, a fifth ground 416e, a sixth ground 416f, a fourth current source 435, a fifth current source 437, a sixth current source 439, a third switching device 440, and a fourth switching device 442. In one embodiment, the fourth active RF mixer apparatus 1200 is substantially identical to the first active RF mixer apparatus 500, the second active RF mixer apparatus 600, and the third active RF mixer apparatus 900. Although not all components of the first active RF mixer apparatus 500, the second active RF mixer apparatus 600, the third active RF mixer apparatus 900, and the fourth active RF mixer apparatus 1200 are shown in FIG. 18, it is to be understood that the first active RF mixer apparatus 500, the second active RF mixer apparatus 600, the third active RF mixer apparatus 900, and the fourth active RF mixer apparatus 1200 include all necessary components even if they are not described in detail herein.

In one particular embodiment, the active RF mixer apparatus 500 includes a first commutator sub-cell 542 and a second commutator sub-cell 544. The first commutator sub-cell 542 is substantially identical to the first commutator sub-cell 342 of FIG. 13 and the second commutator sub-cell 544 is substantially identical to the second commutator sub-cell 344 of FIG. 13. The first commutator sub-cell 542 includes a first RF input terminal 502a, which may also be referred to as the $RF_{p1}$ input terminal, and the second commutator sub-cell 544 includes a second RF input terminal 502b, which may also be referred to as the $RF_{m1}$ input terminal. In one particular embodiment, the active RF mixer apparatus 600 includes a first commutator sub-cell 642 and a second commutator sub-cell 644. The first commutator sub-cell 642 is substantially identical to the first commutator sub-cell 342 of FIG. 13 and the second commutator sub-cell 644 is substantially identical to the second commutator sub-cell 344 of FIG. 13. The first commutator sub-cell 642 includes a first RF input terminal 602a, which may also be referred to as the $RF_{p2}$ input terminal, and the second commutator sub-cell 644 includes a second RF input terminal 602b, which may also be referred to as the $RF_{m2}$ input terminal. In one particular embodiment, the active RF mixer apparatus 900 includes a first commutator sub-cell 942 and a second commutator sub-cell 944. The first commutator sub-cell 942 is substantially identical to the first commutator sub-cell 342 of FIG. 13 and the second commutator sub-cell 944 is substantially identical to the second commutator sub-cell 344 of FIG. 13. The first commutator sub-cell 942 includes a first RF input terminal 902a, which may also be referred to as the $RF_{p3}$ input terminal, and the second commutator sub-cell 944 includes a second RF input terminal 902b, which may also be referred to as the $RF_{m3}$ input terminal. In one particular embodiment, the active RF mixer apparatus 1200 includes a first commutator sub-cell 1242 and a second commutator sub-cell 1244. The first commutator sub-cell 1242 is substantially identical to the first commutator sub-cell 342 of FIG. 13 and the second commutator sub-cell 1244 is substantially identical to the second commutator sub-cell 344 of FIG. 13. The first commutator sub-cell 1242 includes a first RF input terminal 1202a, which may also be referred to as the $RF_{p4}$ input terminal, and the second commutator sub-cell 1244 includes a second RF input terminal 1202b, which may also be referred to as the $RF_{m4}$ input terminal.

The first active RF mixer apparatus 500 includes a first control mechanism 546 to activate or deactivate the first commutator sub-cell 542. In one example, the control mechanism 546 is a base voltage 548 and a resistor 550. The second active RF mixer apparatus 500 includes a second control mechanism 552 to activate or deactivate the second commutator sub-cell 544. In one example, the second control mechanism 552 is a base voltage 554 and a resistor 556.

The second active RF mixer apparatus 600 includes a first control mechanism 646 to activate or deactivate the first commutator sub-cell 642. In one example, the control mechanism 646 is a base voltage 648 and a resistor 650. The second active RF mixer apparatus 600 includes a second control mechanism 652 to activate or deactivate the second commutator sub-cell 644. In one example, the second control mechanism 652 is a base voltage 654 and a resistor 656.

The third active RF mixer apparatus 900 includes a first control mechanism 946 to activate or deactivate the first commutator sub-cell 942. In one example, the control mechanism 946 is a base voltage 948 and a resistor 950. The third active RF mixer apparatus 900 includes a second control mechanism 952 to activate or deactivate the second commutator sub-cell 944. In one example, the second control mechanism 952 is a base voltage 954 and a resistor 956.

The fourth active RF mixer apparatus 1200 includes a first control mechanism 1246 to activate or deactivate the first commutator sub-cell 1242. In one example, the control mechanism 1246 is a base voltage 1248 and a resistor 1250. The fourth active RF mixer apparatus 1200 includes a second control mechanism 1252 to activate or deactivate the second commutator sub-cell 1244. In one example, the second control mechanism 1252 is a base voltage 1254 and a resistor 1256.

In one particular embodiment, the fourth transformer 424 includes a primary 424a and a secondary 424b which includes a center tap 424bb. In one example, the fourth transformer 424 is a 1:1 planar transformer; however, any suitable transformers may be utilized.

In one particular embodiment, the primary 418a of the first transformer 418 is connected to the first RF input terminal 402a, or the $RF_{ps}$ input terminal, the primary 420a of the second transformer 420, the primary 422a of the third transformer 422, and the primary 424a of the fourth transformer 424 in series. The primary 424a of the fourth transformer 424 is connected to the second RF input terminal 402b, or the $RF_{ms}$ input terminal.

In one particular embodiment, the secondary 420b of the second transformer 420 is connected to the first RF input terminal 502a, or the $RF_{p1}$ input terminal, the second current source 432 via center tap 420bb, the second RF input terminal 602b, or the $RF_{m2}$ input terminal, the first switching device 436, and the second switching device 438. The secondary 422b of the third transformer 422 is connected to the first RF input terminal 602a, or the $RF_{p2}$ input terminal, the third current source 434 via center tap 422bb, the second RF input terminal 902b, or the $RF_{m3}$ input terminal, the second switching device 438 and the third switching device 440. The secondary 424b of the fourth transformer 424 is connected to the first RF input terminal 902a, or the $RF_{p3}$ input terminal, the fourth current source 435 via center tap 424bb, the second RF input terminal 1202b, or the $RF_{m4}$ input terminal, the third switching device 440 and the fourth switching device 442. The secondary 418b of the first transformer 418 is connected to the first RF input terminal 1202a, or the $RF_{p4}$ input terminal, the first current source 430 via center tap 418bb, the second RF input terminal 502b, or the $RF_{m1}$ input terminal, the fourth switching device 442 and the first switching device 436. The fifth current source 437 is operatively connected to the first active RF mixer apparatus 500 and the sixth current course is operatively connected to the third active RF mixer apparatus 600.

In one particular embodiment, the base voltage 548 of the first control mechanism 546 is connected to the resistor 550 of the first control mechanism 546 and the resistor 550 is connected to the first commutator sub-cell 542 in any suitable manner. In one particular embodiment, the base voltage 554 of the second control mechanism 552 is connected to the resistor 556 of the second control mechanism 552 and the resistor 556 is connected to the second commutator sub-cell 544 in any suitable manner.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In one particular embodiment, the base voltage 948 of the first control mechanism 946 is connected to the resistor 950 of the first control mechanism 946 and the resistor 950 is connected to the first commutator sub-cell 942 in any suitable manner. In one particular embodiment, the base voltage 954 of the second control mechanism 952 is connected to the resistor 956 of the second control mechanism 952 and the resistor 956 is connected to the second commutator sub-cell 944 in any suitable manner.

In one particular embodiment, the base voltage 1248 of the first control mechanism 1246 is connected to the resistor 1250 of the first control mechanism 1246 and the resistor 1250 is connected to the first commutator sub-cell 1242 in any suitable manner. In one particular embodiment, the base voltage 1254 of the second control mechanism 1252 is connected to the resistor 1256 of the second control mechanism 1252 and the resistor 1256 is connected to the second commutator sub-cell 1244 in any suitable manner.

In operation, the reconfigurable quadruple-cell active RF mixer apparatus 1100 operates as a quadruple-cell active RF mixer apparatus, or a double-cell active RF mixer apparatus, or a single-cell active RF mixer apparatus depending on its configuration and as described below.

The reconfigurable quadruple-cell active RF mixer apparatus 1100 operates as a quadruple-cell active RF mixer apparatus when the first current source 430, the second current source 432, the third current source 434, and the fourth current source 435 are active, the first switching device 436 is "off," the second switching device 438 is "off," the third switching device 440 is "off," the fourth switching device 442 is "off," the first commutator sub-cell 542 of the first RF active mixer apparatus 500 is active, the second sub-cell 544 of the first active RF mixer apparatus 500 is active, the first commutator sub-cell 642 of the second RF active mixer apparatus 600 is active, the second sub-cell 644 of the second active RF mixer apparatus 600 is active, the first commutator sub-cell 942 of the third RF active mixer apparatus 900 is active, the second sub-cell 944 of the third active RF mixer apparatus 900 is active, the first commutator sub-cell 1242 of the fourth RF active mixer apparatus 1200 is active, and the second sub-cell 1244 of the fourth active RF mixer apparatus 1200 is active. When the reconfigurable quadruple-cell active RF mixer apparatus 1100 is in this configuration, the reconfigurable quadruple-cell active RF mixer apparatus 1100 operates as a quadruple-cell mixer in accordance with the teachings of the present disclosure. Specifically, the first commutator sub-cell 542 of the first active RF mixer apparatus 500 and the second commutator sub-cell 644 of the second active RF mixer apparatus 600 are operatively connected to form a first commutator cell, the first commutator sub-cell 642 of the second active RF mixer apparatus 600 and the second commutator sub-cell 944 of the third active RF mixer apparatus 900 are operatively connected to form a second commutator cell, the first commutator sub-cell 942 of the third active RF mixer apparatus 900 and the second commutator sub-cell 1244 of the fourth active RF mixer apparatus 1200 are operatively connected to form a third commutator cell, and the first commutator sub-cell 1242 of the fourth active RF mixer apparatus 1200 and the second commutator sub-cell 544 of the first active RF mixer apparatus 500 are operatively connected to form a fourth commutator cell.

In operation, an RF input signal (not shown) is split by the first transformer 418, the second transformer 420, the third transformer 422, and the fourth transformer 424 and fed to the first commutator cell formed by the first commutator sub-cell 542 and the second commutator sub-cell 644, the second commutator cell formed by the first commutator sub-cell 642 and the second commutator sub-cell 944, the third commutator cell formed by the first commutator sub-cell 942 and the second commutator sub-cell 1244, and the fourth commutator cell formed by the first commutator sub-cell 1242 and the second commutator sub-cell 544. The first commutator cell, the second commutator cell, the third commutator cell, and the fourth commutator cell are driven by the LO input terminal. The first commutator cell has a bias current from the second current source 432, or $I_2$, the second commutator cell has a bias current from the third current source 434, or $I_3$, the third commutator cell has a bias current from the fourth current source 435, or $I_4$, and the fourth commutator cell has a bias current from the first current source 430, or $I_1$. In one example, $I_1$, $I_2$, $I_3$, and $I_4$ are equal and are each one fourth of the total commutator cell DC. The RF input signal is down-converted to a desired IF signal. The outputs of the first commutator cell, the second commutator cell, the third commutator cell, and the fourth commutator cell are connected in parallel combining the currents of the first commutator cell, the second commutator cell, the third commutator cell, and the fourth commutator cell.

In one example, the architecture of the reconfigurable quadruple-cell active RF mixer apparatus 1100 simultaneously provides improved power handling and improved impedance matching compared to conventional active RF mixers including the PRIOR ART mixers 10, 30 and 50. In one example, the architecture allows the reconfigurable quadruple-cell active RF mixer apparatus 1100 to operate with larger DC while increasing the input intercept point (IIP3) and the 1 dB compression point (P1db).

More specifically, and in one example, the improved power handling and improved impedance matching is accomplished by splitting the total DC (I) equally (I/4) between the first commutator cell, the second commutator cell, the third commutator cell, and the fourth commutator cell. An RF source impedance (not shown) is presented to the RF input terminal 402a and 402b. The total commutator cell impedance, which is the sum of the first commutator cell impedance (not shown), the second commutator cell impedance (not shown), the third commutator cell impedance (not shown), and the fourth commutator cell impedance (not shown) is matched to the RF source impedance (not shown). In one example, the individual commutator cell impedance $$\left(\propto \frac{4}{I}\right)$$

is four times greater than the total commutator cell impedance of the PRIOR ART active RF mixers 10, 30 and 50. The RF impedances of each commutator cell are additively summed at the RF input terminal 402a and 402b by 1:1 transformers 418, 420, 422, and 424 whose primaries 418a, 420a, 422a, and 424a are connected in series which provides a total RF impedance that is sixteen times greater than the RF impedances presented by the PRIOR ART active RF mixers 10, 30 and 50. The impedance transformation is accomplished, at least in part, by current splitting between three commutator cells and using 1:1 transformers. A 1:1 transformer has a stronger magnetic coupling factor k with equal primary and secondary turns compared to other transformers, such as a 1:4 transformer. This minimizes leakage flux present in 1:1 transformers and also yields low-loss with improved passive transformation efficiency and broadband matching. Further, the linearity of the reconfigurable quadruple-cell active RF mixer apparatus 1100 is improved by operating in a higher DC range compared to conventional active RF mixers.

In one particular embodiment, the reconfigurable quadruple-cell active RF mixer apparatus 1100 operates as a double-cell active RF mixer apparatus when the first current source 430 is inactive, the second current source 432 is inactive, the third current source 434 is inactive, the fourth current source 435 is inactive, the fifth current source 437 is active, the sixth current source 439 is active, the first switching device 436 is "on," the second switching device 438 is "off," the third switching device 440 is "on," the fourth switching device 442 is "off," the first commutator sub-cell 542 of the first active RF mixer apparatus 500 is inactive, the second commutator sub-cell 544 of the first active RF mixer apparatus 500 is inactive, the first commutator sub-cell 642 of the second RF active mixer apparatus 600 is active, the second sub-cell 644 of the second active RF mixer apparatus 600 is active, the first commutator sub-cell 942 of the third RF active mixer apparatus 900 is inactive, the second sub-cell 944 of the second active RF mixer apparatus 900 is inactive, the first commutator sub-cell 1242 of the fourth RF active mixer apparatus 1200 is active, and the second sub-cell 1244 of the fourth active RF mixer apparatus 1200 is active. When the reconfigurable quadruple-cell active RF mixer apparatus 1100 is in this configuration, the reconfigurable quadruple-cell active RF mixer apparatus 1100 operates as a double-cell mixer in accordance with the teachings of the present disclosure. Specifically, the first commutator sub-cell 642 of the second active RF mixer apparatus 600 and the second commutator sub-cell 1244 of the fourth active RF mixer apparatus 1200 are operatively connected to form a first commutator cell and the second commutator sub-cell 644 of the second active RF mixer apparatus 600 and the first commutator sub-cell 1242 of the fourth active RF mixer apparatus 1200 are operatively connected to form a second commutator cell.

In one particular embodiment, the reconfigurable quadruple-cell active RF mixer apparatus 1100 operates as a single-cell active RF mixer apparatus when the first current source 430 is inactive, the second current source 432 is inactive, the third current source 434 is inactive, the fourth current source 435 is inactive, the fifth current source 437 is inactive, the sixth current source 439 is active, the first switching device 436 is "off," the second switching device 438 is "on," the third switching device 440 is "on," the fourth switching device 442 is "on," the first commutator sub-cell 542 of the first active RF mixer apparatus 500 is active, the second commutator sub-cell 544 of the first active RF mixer apparatus 500 is active, the first commutator sub-cell 642 of the second RF active mixer apparatus 600 is inactive, the second sub-cell 644 of the second active RF mixer apparatus 600 is inactive, the first commutator sub-cell 942 of the third RF active mixer apparatus 900 is inactive, the second sub-cell 944 of the second active RF mixer apparatus 900 is inactive, the first commutator sub-cell 1242 of the fourth RF active mixer apparatus 1200 is inactive, and the second sub-cell 1244 of the fourth active RF mixer apparatus 1200 is inactive. When the reconfigurable quadruple-cell active RF mixer apparatus 1100 is in this configuration, the reconfigurable quadruple-cell active RF mixer apparatus 1100 operates as a single-cell mixer in accordance with the teachings of the present disclosure. Specifically, the first commutator sub-cell 542 of the first active RF mixer apparatus 500 and the second commutator sub-cell 544 of the first active RF mixer apparatus 500 are operatively connected to form a single commutator cell.

Figure 19:
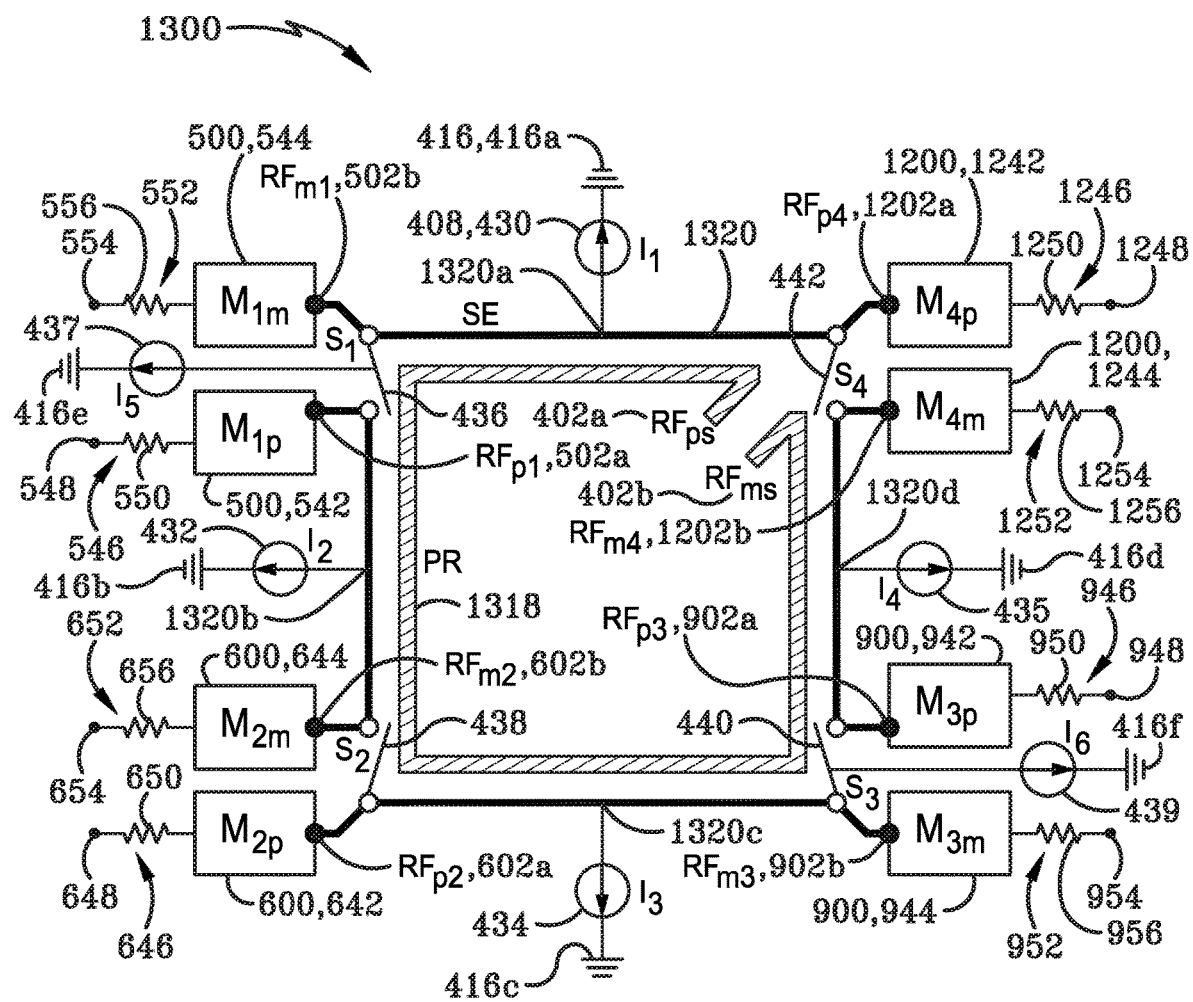
FIG. 19 is a schematic view of one embodiment of a reconfigurable quadruple-cell active RF mixer apparatus in accordance with one aspect of the present disclosure.

FIG. 19 is a schematic view of one embodiment of a reconfigurable quadruple-cell (i.e. four commutator cells) active RF mixer apparatus 1300 in accordance with one aspect of the present disclosure. The reconfigurable quadruple-cell active RF mixer apparatus 1300 is substantially identical to the reconfigurable quadruple-cell active RF mixer apparatus 1100 of FIG. 18 in structure and function with a few exceptions/additions that will be discussed hereafter in greater detail. Instead of utilizing transformers having a primary coil and a secondary coil, the reconfigurable quadruple-cell active RF mixer apparatus 1300 includes a primary slab transformer 1318 and a secondary slab transformer 1320. In one particular embodiment, the secondary slab transformer 1320 includes a first center tap 1320a, a second center tap 1320b, a third center tap 1320c, and a fourth center tap 1320d. The primary slab transformer 1318 and the secondary slab transformer 1320 may be configured in any suitable manner.

In one particular embodiment, the primary slab transformer 1318 is connected to the first RF input terminal 402a, or the $RF_{ps}$ input terminal, and the second RF input terminal 402b, or the $RF_{ms}$ input terminal.

In one particular embodiment, the secondary slab transformer 1320 is connected to the first RF input terminal 502a, or the $RF_{p1}$ input terminal, the second current source 432 via center tap 1320b, the second RF input terminal 602b, or the $RF_{m2}$ input terminal, the first switching device 436, the second switching device 438, the first RF input terminal 602a, or the $RF_{p2}$ input terminal, the third current source 434 via center tap 1320c, the second RF input terminal 902b, or the $RF_{m3}$ input terminal, the third switching device 440, the first RF input terminal 902a, or the $RF_{p3}$ input terminal, the fourth current source 435 via center tap 1320d, the second RF input terminal 1202b, or the $RF_{m4}$ input terminal, the fourth switching device 442, the first RF input terminal 1202a, or the $RF_{p4}$ input terminal, the first current source 430 via center tap 1320a, the second RF input terminal 502b, or the $RF_{m1}$ input terminal, and the first switching device 436. The fifth current source 437 is operatively connected to the first active RF mixer apparatus 500 and the sixth current course is operatively connected to the third active RF mixer apparatus 600.

In one particular embodiment, the base voltage 548 of the first control mechanism 546 is connected to the resistor 550 of the first control mechanism 546 and the resistor 550 is connected to the first commutator sub-cell 542 in any suitable manner. In one particular embodiment, the base voltage 554 of the second control mechanism 552 is connected to the resistor 556 of the second control mechanism 552 and the resistor 556 is connected to the second commutator sub-cell 544 in any suitable manner.

In one particular embodiment, the base voltage 648 of the first control mechanism 646 is connected to the resistor 650 of the first control mechanism 646 and the resistor 650 is connected to the first commutator sub-cell 642 in any suitable manner. In one particular embodiment, the base voltage 654 of the second control mechanism 652 is connected to the resistor 656 of the second control mechanism 652 and the resistor 656 is connected to the second commutator sub-cell 644 in any suitable manner.

In one particular embodiment, the base voltage 948 of the first control mechanism 946 is connected to the resistor 950 of the first control mechanism 946 and the resistor 950 is connected to the first commutator sub-cell 942 in any suitable manner. In one particular embodiment, the base voltage 954 of the second control mechanism 952 is connected to the resistor 956 of the second control mechanism 952 and the resistor 956 is connected to the second commutator sub-cell 944 in any suitable manner.

In one particular embodiment, the base voltage 1248 of the first control mechanism 1246 is connected to the resistor 1250 of the first control mechanism 1246 and the resistor 1250 is connected to the first commutator sub-cell 1242 in any suitable manner. In one particular embodiment, the base voltage 1254 of the second control mechanism 1252 is connected to the resistor 1256 of the second control mechanism 1252 and the resistor 1256 is connected to the second commutator sub-cell 1244 in any suitable manner.

In operation, the reconfigurable quadruple-cell active RF mixer apparatus 1300 operates as a quadruple-cell active RF mixer apparatus, a double-cell active RF mixer apparatus, or a single-cell active RF mixer apparatus depending on its configuration in a substantially identical manner to the reconfigurable quadruple-cell active RF mixer apparatus 1100 of FIG. 18 and thus will not be further described herein.

Figure 20:
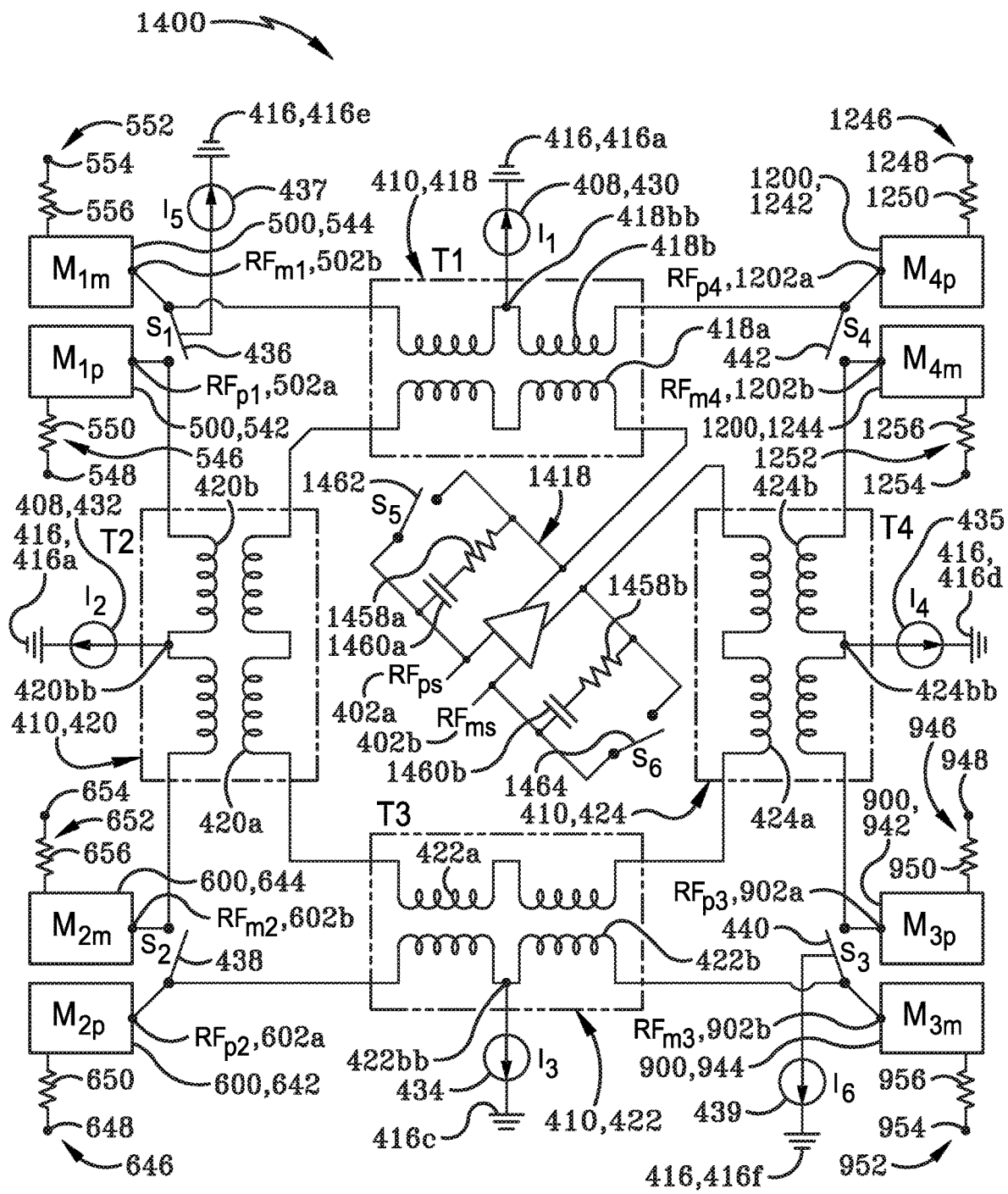
FIG. 20 is a schematic view of one embodiment of a reconfigurable quadruple-cell active RF mixer apparatus including an amplifier mechanism in accordance with one aspect of the present disclosure.

FIG. 20 is a schematic view of one embodiment of a reconfigurable quadruple-cell (i.e. four commutator cells) active RF mixer apparatus 1400 in accordance with one aspect of the present disclosure. The reconfigurable quadruple-cell active RF mixer apparatus 1400 is substantially identical to the reconfigurable quadruple-cell active RF mixer apparatus 1100 of FIG. 18 in structure and function with a few exceptions/additions that will be discussed hereafter in greater detail. The reconfigurable quadruple-cell active RF mixer apparatus 1400 includes an amplifier mechanism 1418 connected between the primary 418a of the first transformer 418 and the first RF input terminal 402a, or the $RF_{ps}$ input terminal and between the primary 424a of the fourth transformer 424 is connected to the second RF input terminal 402b, or the $RF_{ms}$ input terminal. In one particular embodiment, the amplifier mechanism 1418 is a series-shunt feedback amplifier and is substantially identical to the amplifier mechanism 218 of FIG. 6; however, not all components of the amplifier mechanism 1418 are shown in FIG. 20 for clarity. The series-shunt feedback amplifier includes a first shunt resistor 1458a, a second shunt resistor 1458b, a first shunt capacitor 1460a, and a second shunt capacitor 1460b, a first bypass switch 1462, a second bypass switch 1464, and the amplifier mechanism 1418. The first bypass switch 1462 is connected across the first shunt resistor 1458a and the first shunt capacitor 1460a and the second bypass switch 1464 is connected across the second shunt resistor 1458b and the second shunt capacitor 1460b.

In operation, the reconfigurable quadruple-cell active RF mixer apparatus 1400 operates in a substantially identical manner to the reconfigurable quadruple-cell active RF mixer apparatus 1100 of FIG. 18 with a few exceptions/additions that will be discussed hereafter in greater detail. The reconfigurable quadruple-cell active RF mixer apparatus 1400 operates with an amplifying function of the amplifier mechanism 1418 or without the amplifying function of the amplifier mechanism 1418 depending in the configuration of the reconfigurable quadruple-cell active RF mixer apparatus 1400. The reconfigurable quadruple-cell active RF mixer apparatus 1400 operates with the amplifying function when the first bypass switch 1462 and the second bypass switch 1464 are "off." The reconfigurable quadruple-cell active RF mixer apparatus 1400 operates without the amplifying function when the first bypass switch 1462 and the second bypass switch 1464 are "on." As such, the gain can be changed because the reconfigurable quadruple-cell active RF mixer apparatus 1400 includes an impedance matched RF Amplifier integrated with an impedance matched multi-cell core.

This is beneficial compared to conventional active RF mixers, including the PRIOR ART mixers 10, 30 and 50, because conventional active RF mixers cannot typically change the gain of the system without introducing significant impedance mismatch.

As described above, the operation of the reconfigurable RF mixer apparatuses 400, 700, 800, 1100, 1300, and 1400, is reconfigurable based, at least in part, on the plurality of selectively active commutator cells. As described above, the commutator cells may be selectively activated by selectively activating various current sources to be supplied to the commutator cells, and the various current sources, in some embodiments, may be selectively activated via switching devices (e.g., by closing or opening a switch operatively connected to a current source); however the commutator cells may be selectively activated in any suitable manner.

In accordance with one aspect of the disclosure, a method of reconfiguring an active RF mixer apparatus is provided herein. The method includes selectively activating at least of one of a plurality of commutator cells in a radio frequency (RF) mixer apparatus, mixing RF signals in the RF mixer apparatus in a first operation configuration based, at least in part, on the selectively activated at least one commutator cell; and mixing RF signals in the RF mixer apparatus in a second operation configuration based, at least in part, on the selectively activated at least one commutator cell that is different than the selectively activated at least one commutator cell of the first operation configuration. In one embodiment, the method includes actively powering one commutator cell in the first operation configuration and actively powering two commutator cells in the second operation configuration. In another embodiment, the method includes actively powering one commutator cell in the first operation configuration and actively powering three commutator cells in the second operation configuration.

The method may further include mixing RF signals in the RF mixer apparatus in a third operation configuration based, at least in part, on the selectively activated at least one commutator cell that is different than the selectively activated at least one commutator cell of the first operation configuration and the selectively activated at least one commutator cell of the second operation configuration. In this embodiment, the method includes actively powering one commutator cell in the first operation configuration, actively powering two commutator cells in the second operation configuration, and actively powering four commutator cells in the third operation configuration.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral" and the like are used herein for the purpose of explanation only unless specifically indicated otherwise.

Although the terms "first" and "second" may be used herein to describe various features/elements, these features/ elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, any method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A radio frequency (RF) mixer apparatus comprising:
a plurality of transformers; wherein each of the plurality of transformers includes a primary and a secondary; wherein each primary is connected in series;
a plurality of selectively active commutator cells; wherein each of the plurality of commutator cells is coupled to a local oscillator (LO) port in parallel and an intermediate frequency (IF) port in parallel; and wherein each secondary is connected across one selectively active commutator cell of the plurality of commutator cells; and
a plurality of selectively active current sources selectively providing a total commutator cell current to the plurality of selectively active commutator cells; wherein the operation of the RF mixer apparatus is reconfigurable based, at least in part, on the plurality of selectively active commutator cells.

2. The RF mixer apparatus of claim 1, further comprising:
at least one switching device operatively coupled to at least one of the plurality of selectively active commutator cells; wherein the at least one switching device is configured to selectively activate at least one of the plurality of selectively active current sources.

3. The RF mixer apparatus of claim 1, further comprising:
a gain of the RF mixer apparatus; and
an amplifier mechanism connected across the series connection of the primaries of the plurality of transformers; wherein the amplifier mechanism is configured to change the gain of the RF mixer apparatus.

4. The RF mixer apparatus of claim 3, further comprising:
a total commutator cell impedance presented by the plurality of selectively active commutator cells;
an RF source impedance presented to an RF port; and
an output impedance presented by the amplifier mechanism; wherein the total commutator cell impedance is substantially matched to the RF source impedance; and wherein the total commutator cell impedance is substantially matched to the output impedance presented by the amplifier mechanism.

5. The RF mixer apparatus of claim 4, further comprising:
at least one switching device operatively coupled to the amplifier mechanism; wherein the at least one switching device is configured to selectively bypass the amplifier mechanism; and wherein when the at least one switching device causes an RF signal to bypass the amplifier mechanism, the total commutator cell impedance is substantially matched to the RF source impedance.

6. The RF mixer apparatus of claim 2, wherein the reconfigurable operation configuration includes a first operation configuration and a second operation configuration; wherein the plurality of selectively active commutator cells further comprises:
a selectively active first commutator cell; and
a selectively active second commutator cell; wherein the first operation configuration utilizes one of the selectively active first commutator cell and the selectively active second commutator cell; and wherein the second operation configuration utilizes both of the selectively active first commutator cell and the selectively active second commutator cell.

7. The RF mixer apparatus of claim 6, wherein the first operation configuration utilizes one of the plurality of selectively active current sources; and wherein the second operation configuration utilizes two of the plurality of selectively active current sources.

8. The RF mixer apparatus of claim 6, wherein when the RF mixer apparatus is in the first operation configuration the at least one switching device is open; and wherein when the RF mixer apparatus is in the second operation configuration the at least one switching device is closed.

9. The RF mixer apparatus of claim 2, wherein the reconfigurable operation configuration includes a first operation configuration and a second operation configuration; wherein the plurality of selectively active commutator cells further comprises:
a selectively active first commutator cell;
a selectively active second commutator cell; and
a selectively active third commutator cell; wherein the first operation configuration utilizes one of the selectively active first commutator cell, the selectively active second commutator cell, and the selectively active third commutator cell; and wherein the second operation configuration utilizes two of the selectively active first commutator cell, the selectively active second commutator cell, and the selectively active third commutator cell.

10. The RF mixer apparatus of claim 9, wherein the first operation configuration utilizes one of the plurality of selectively active current sources; and wherein the second operation configuration utilizes two of the plurality of selectively active current sources.

11. The RF mixer apparatus of claim 9, wherein the at least one switching device further comprises:
a first switching device; and
a second switching device; wherein when the RF mixer apparatus is in the first operation configuration the first switching device is closed and the second switching device is closed; and wherein when the RF mixer apparatus is in the second operation configuration the first switching device is open and the second switching device is open.

12. The RF mixer apparatus of claim 2, wherein the reconfigurable operation configuration includes a first operation configuration, a second operation configuration, and a third operation configuration; wherein the plurality of selectively active commutator cells further comprises:
a selectively active first commutator cell;
a selectively active second commutator cell;
a selectively active third commutator cell;
a selectively active fourth commutator cell;
wherein the first operation configuration utilizes one of the selectively active first commutator cell, the selectively active second commutator cell, the selectively active third commutator cell, and the selectively active fourth commutator cell;
wherein the second operation configuration utilizes two of the selectively active first commutator cell, the selectively active second commutator cell, the selectively active third commutator cell, and the selectively active fourth commutator cell; and
wherein the third operation configuration utilizes each of the selectively active first commutator cell, the selectively active second commutator cell, the selectively active third commutator cell, and the selectively active fourth commutator cell.

13. The RF mixer apparatus of claim 12, wherein the first operation configuration utilizes one of the plurality of selectively active current sources; and wherein the second operation configuration utilizes two of the plurality of selectively active current sources; and wherein the third configuration utilizes four of the plurality of selectively active current sources.

14. The RF mixer apparatus of claim 12, wherein the at least one switching device further comprises:
a first switching device;
a second switching device;
a third switching device;
a fourth switching device; wherein when the RF mixer apparatus is in the first operation configuration the first switching device is open, the second switching device is closed, the third switching device is closed, and the fourth switching device is closed;
wherein when the RF mixer apparatus is in the second operation configuration the first switching device is closed, the second switching device is open, the third switching device is closed, and the fourth switching device is open; and
wherein when the RF mixer apparatus is in the third operation configuration the first switching device is open, the second switching device is open, the third switching device is open, and the fourth switching device is open.

15. The RF mixer apparatus of claim 1, wherein each of the plurality of selectively active commutator cells further comprises:
a first differential pair of selectively active commutator sub-cells; and
a second differential pair of selectively active commutator sub-cells.

16. The RF mixer apparatus of claim 15, wherein one selectively active commutator sub-cell of the first differential pair of selectively active commutator sub-cells is operatively coupled to one selectively active commutator sub-cell of the second differential pair of selectively active commutator sub-cells; and wherein the other selectively active commutator sub-cell of the first differential pair of selectively active commutator sub-cells is operatively coupled to the other selectively active commutator sub-cell of the second pair of selectively active commutator sub-cells.

17. A method comprising:
selectively activating at least of one of a plurality of commutator cells in a radio frequency (RF) mixer apparatus, said mixer apparatus comprising a plurality of transformers, wherein each of the plurality of transformers includes a primary and a secondary; wherein each primary is connected in series, and wherein each of the plurality of commutator cells is coupled to a local oscillator (LO) port in parallel and an intermediate frequency (IF) port in parallel, and wherein each secondary is connected across one selectively activated commutator cell;
selectively activating a plurality of current sources selectively providing a total commutator cell current to the plurality of commutator cells, wherein the operation of the RF mixer apparatus is reconfigurable based, at least in part, on the plurality of commutator cells;
mixing RF signals in the RF mixer apparatus in a first operation configuration based, at least in part, on the selectively activated at least one commutator cell; and mixing RF signals in the RF mixer apparatus in a second operation configuration based, at least in part, on the selectively activated at least one commutator cell that is different than the selectively activated at least one commutator cell of the first operation configuration.

18. The method of claim 17, further comprising:

actively powering one commutator cell in the first operation configuration; and actively powering two commutator cells in the second operation configuration.

19. The method of claim 17, further comprising:

actively powering one commutator cell in the first operation configuration; and actively powering three commutator cells in the second operation configuration.

20. The method of claim 17, further comprising:

mixing RF signals in the RF mixer apparatus in a third operation configuration based, at least in part, on the selectively activated at least one commutator cell that is different than the selectively activated at least one commutator cell of the first operation configuration and the selectively activated at least one commutator cell of the second operation configuration;

actively powering one commutator cell in the first operation configuration;

actively powering two commutator cells in the second operation configuration; and actively powering four commutator cells in the third operation configuration.

* * * * *